United States Patent
Kim et al.

(10) Patent No.: US 11,514,997 B2
(45) Date of Patent: Nov. 29, 2022

(54) CONTROLLER, A STORAGE DEVICE INCLUDING THE CONTROLLER, AND A READING METHOD OF THE STORAGE DEVICE

(71) Applicant: SAMSUNG ELECTRONICS CO., LTD., Suwon-si (KR)

(72) Inventors: Jinyoung Kim, Seoul (KR); Sehwan Park, Yongin-si (KR); Ilhan Park, Suwon-si (KR); Sangwan Nam, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 62 days.

(21) Appl. No.: 17/156,801

(22) Filed: Jan. 25, 2021

(65) Prior Publication Data

US 2022/0005539 A1 Jan. 6, 2022

(30) Foreign Application Priority Data

Jul. 2, 2020 (KR) .................. 10-2020-0081240

(51) Int. Cl.
*G11C 29/42* (2006.01)
*G11C 29/18* (2006.01)
*G11C 29/44* (2006.01)
*G11C 29/12* (2006.01)

(52) U.S. Cl.
CPC .............. *G11C 29/42* (2013.01); *G11C 29/18* (2013.01); *G11C 29/44* (2013.01); *G11C 2029/1202* (2013.01)

(58) Field of Classification Search
CPC ......... G11C 29/42; G11C 29/18; G11C 29/44; G11C 2029/1202
See application file for complete search history.

(56) References Cited

U.S. PATENT DOCUMENTS

| | | |
|---|---|---|
| 9,836,219 B2 | 12/2017 | Kim et al. |
| 10,163,518 B2 | 12/2018 | Yoon et al. |
| 10,255,972 B1 | 4/2019 | Sato |
| 10,490,285 B2 | 11/2019 | Yoon et al. |

(Continued)

FOREIGN PATENT DOCUMENTS

KR 10-2016-0038642 4/2016

*Primary Examiner* — Tuan T Nguyen
(74) *Attorney, Agent, or Firm* — F. Chau & Associates, LLC

(57) ABSTRACT

A controller including: control pins for providing control signals to a nonvolatile memory; a buffer memory configured to store first to third tables; and an error correction code (ECC) circuit configured to correct an error in first data read from the nonvolatile memory according to a first read command, wherein the first table stores first offset information, the second table stores second offset information, and the third table stores third offset information, wherein the third offset information corresponds to a history read level and is determined by the first and second offset information, and when the error of the first data is uncorrectable, an on-chip valley search operation is performed by the nonvolatile memory according to a second read command, detection information of the on-chip valley search operation is received according to a specific command, and the second offset information which corresponds to the detection information is generated.

7 Claims, 24 Drawing Sheets

(56) References Cited

U.S. PATENT DOCUMENTS

| | | |
|---|---|---|
| 10,573,394 B2 | 2/2020 | Pan et al. |
| 2009/0172499 A1* | 7/2009 | Olbrich ................. G06F 3/0604 |
| | | 714/773 |
| 2009/0222617 A1* | 9/2009 | Yano .................... G06F 11/073 |
| | | 711/170 |
| 2013/0070526 A1* | 3/2013 | Eun .................... G11C 16/3436 |
| | | 365/185.18 |
| 2016/0092130 A1 | 3/2016 | Choi et al. |
| 2019/0108091 A1 | 4/2019 | Chen |
| 2020/0098436 A1 | 3/2020 | Kim et al. |

* cited by examiner

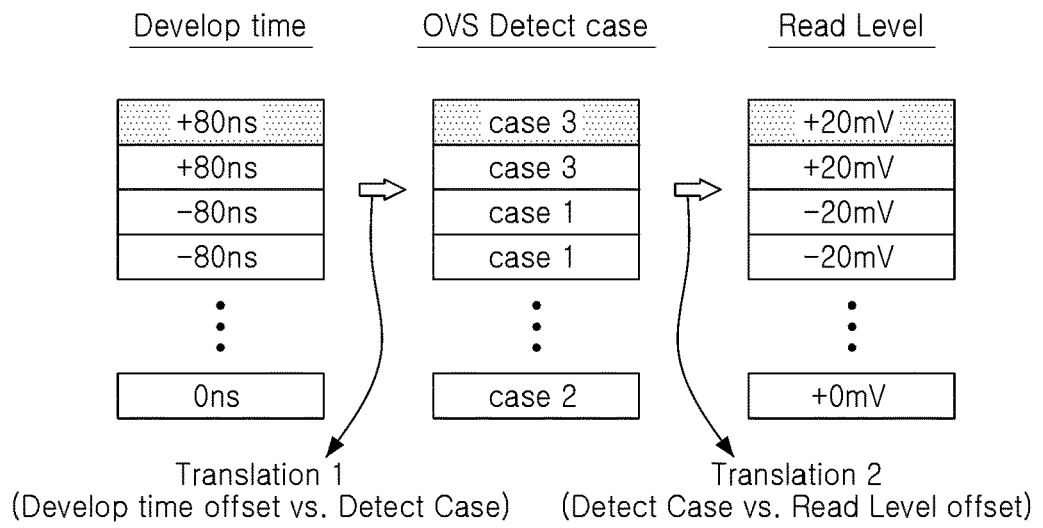
FIG. 7
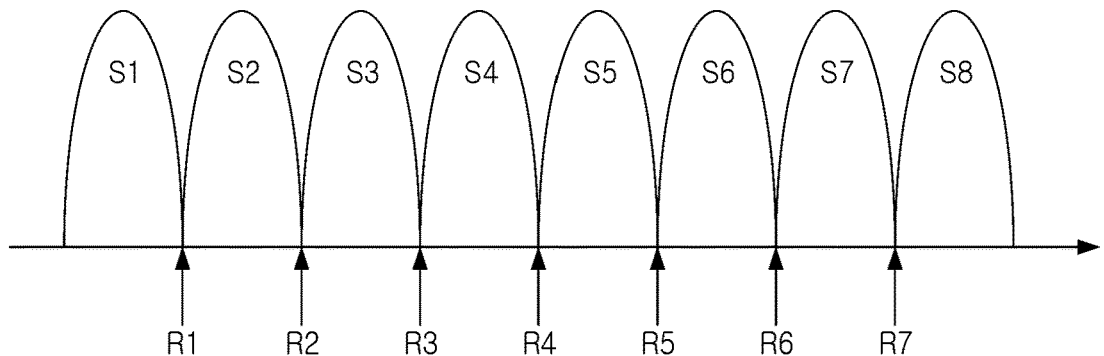
FIG. 8A
|  | | OVS Detection Cases | | | | |
|---|---|---|---|---|---|---|
|  | | C1 | C2 | C3 | C4 | C5 |
| State offset | R1 | −40 mV | −32 mV | 0 mV | 32 mV | 40 mV |
|  | R2 | −30 mV | −24 mV | 0 mV | 24 mV | 30 mV |
|  | R3 | −20 mV | −16 mV | 0 mV | 16 mV | 20 mV |
|  | R4 | −40 mV | −32 mV | 0 mV | 32 mV | 40 mV |
|  | R5 | −60 mV | −48 mV | 0 mV | 48 mV | 60 mV |
|  | R6 | −80 mV | −64 mV | 0 mV | 64 mV | 80 mV |
|  | R7 | −100 mV | −80 mV | 0 mV | 80 mV | 100 mV |
FIG. 8B

| | Case | State | | | | | | | |
|---|---|---|---|---|---|---|---|---|---|
| | | [7] | [6] | [5] | [4] | [3] | [2] | [1] | [0] |
| 1 | Case 1 | | | | | | | | 1 |
| 2 | Case 2 | | | | | | | 1 | |
| 3 | Case 3 | | | | | | 1 | | |
| 4 | Case 4 | | | | | 1 | | | |
| 5 | Case 5 | | | | 1 | | | | |
| 6 | Case 6 | | | 1 | | | | | |
| 7 | Case 7 | Unuse | 1 | | | | | | |

CONTROLLER, A STORAGE DEVICE INCLUDING THE CONTROLLER, AND A READING METHOD OF THE STORAGE DEVICE

CROSS-REFERENCE TO RELATED APPLICATION(S)

This application claims priority under 35 U.S.C. § 119 to Korean Patent Application No. 10-2020-0081240 filed on Jul. 2, 2020 in the Korean Intellectual Property Office, the disclosure of which is incorporated by reference herein in its entirety.

TECHNICAL FIELD

The present inventive concept relates to a controller, a storage device including the controller, and a reading method of the storage device.

DISCUSSION OF RELATED ART

Error correction code (ECC) memory is a type of computer data storage that can detect and correct n-bit data corruption which occurs in memory. In general, a storage device generates an ECC using an ECC circuit in a write operation and corrects an error of data of the ECC in a read operation. However, there may be a case in which memory cells of a storage device have so severely deteriorated that correction cannot be performed by an ECC circuit. In this case, a read retry operation may be performed using a sensing method different from that of a normal read operation.

SUMMARY

According to an exemplary embodiment of the inventive concept, there is provided a controller including: control pins for providing control signals to a nonvolatile memory device; a buffer memory configured to store a first table, a second table, and a third table; and an error correction code (ECC) circuit configured to correct an error in first data read from the nonvolatile memory device according to a first read command, wherein the first table stores first offset information, the second table stores second offset information, and the third table stores third offset information, wherein the third offset information corresponds to a history read level and is determined by the first offset information and the second offset information, and when the error of the first data is uncorrectable by the error correction circuit, an on-chip valley search operation is performed by the nonvolatile memory device according to a second read command, detection information of the on-chip valley search operation is received according to a specific command, and the second offset information which corresponds to the detection information is generated.

According to an exemplary embodiment of the inventive concept, there is provided a storage device including: a nonvolatile memory device; and a controller connected to control pins through which a command latch enable (CLE) signal, an address latch enable (ALE) signal, a chip enable (CE) signal, a write enable (WE) signal, a read enable (RE) signal, and a DQS control signal are exchanged with the nonvolatile memory device, and wherein the controller is configured to read data from the nonvolatile memory device, wherein the nonvolatile memory device performs a read operation by latching a command or an address on an edge of the WE signal according to the CLE signal and the ALE signal, and the nonvolatile memory device performs a normal read operation in response to a first read command received from the controller, performs an on-chip valley search operation in response to a second read command received from the controller, and outputs detection information of the on-chip valley search operation to the controller in response to a specific command received from the controller.

According to an exemplary embodiment of the inventive concept, there is provided a storage device including: a nonvolatile memory device; and a controller configured to control the nonvolatile memory device, wherein the controller receives detection case information based on an on-chip valley search (OVS) operation from the nonvolatile memory device, determines offset information corresponding to the detection case information using an OVS table, and determines a default read level using the offset information.

According to an exemplary embodiment of the inventive concept, there is provided a reading method of a nonvolatile memory device, the reading method including: performing a normal read operation according to a default read level in response to a first read command; performing an on-chip valley search operation in response to a second read command; and outputting detection information of the on-chip valley search operation in response to a specific command.

According to an exemplary embodiment of the inventive concept, there is provided a reading method of a storage device, the reading method including: issuing a read command to a nonvolatile memory device by a controller; issuing a read retry command to the nonvolatile memory device with the controller when an error of data based on the read command is uncorrectable; issuing a specific command to the nonvolatile memory device with the controller after receiving data based on the read retry command from the nonvolatile memory device; receiving information associated with the read retry command corresponding to the specific command with the controller; and changing a default read level using the received information with the controller.

According to an exemplary embodiment of the inventive concept, there is provided a non-volatile memory device including: a memory cell region including a first metal pad; a peripheral circuit region including a second metal pad and vertically connected to the memory cell region by the first metal pad and the second metal pad, a memory cell array disposed to the memory cell region, wherein the memory cell array includes a plurality of memory blocks, each of the memory blocks includes a plurality of memory cells that are programmable, erasable, or readable by voltages supplied via bit lines and word lines; an address decoder disposed in the peripheral circuit region and configured to select a word line of the word lines in response to an address; a page buffer disposed in the peripheral circuit region and configured to sense data from memory cells connected to the selected word line in a read operation; an input/output buffer disposed in the peripheral circuit region and configured to transfer the sensed data to an external device in the read operation; and a control logic disposed in the peripheral circuit region and configured to control the page buffer, the address buffer, and the input/output buffer in the read operation, wherein the control logic performs a normal read operation in response to a first read command received from a controller, performs an on-chip valley search operation in response to a second read command received from the controller, and outputs detection information of the on-chip valley search operation to the controller in response to a specific command received from the controller.

According to an exemplary embodiment of the inventive concept, there is provided a storage device including: a nonvolatile memory device; and a controller configured to: issue a read command to the nonvolatile memory device; issue a read retry command to the nonvolatile memory device when an error of data based on the read command is uncorrectable; issue a specific command to the nonvolatile memory device after receiving data based on the read retry command from the nonvolatile memory device; receive information associated with the read retry command corresponding to the specific command; and change a default read level using the received information.

BRIEF DESCRIPTION OF DRAWINGS

The above and other features of the present inventive concept will be more clearly understood from the following detailed description, taken in conjunction with the accompanying drawings.

FIG. 7 is a diagram illustrating read level offset compensation using an OVS Table (OVST) according to an exemplary embodiment of the inventive concept.

FIGS. 8A and 8B illustrate an OVST according to an exemplary embodiment of the inventive concept.

DETAILED DESCRIPTION OF THE EMBODIMENTS

Figure 1:
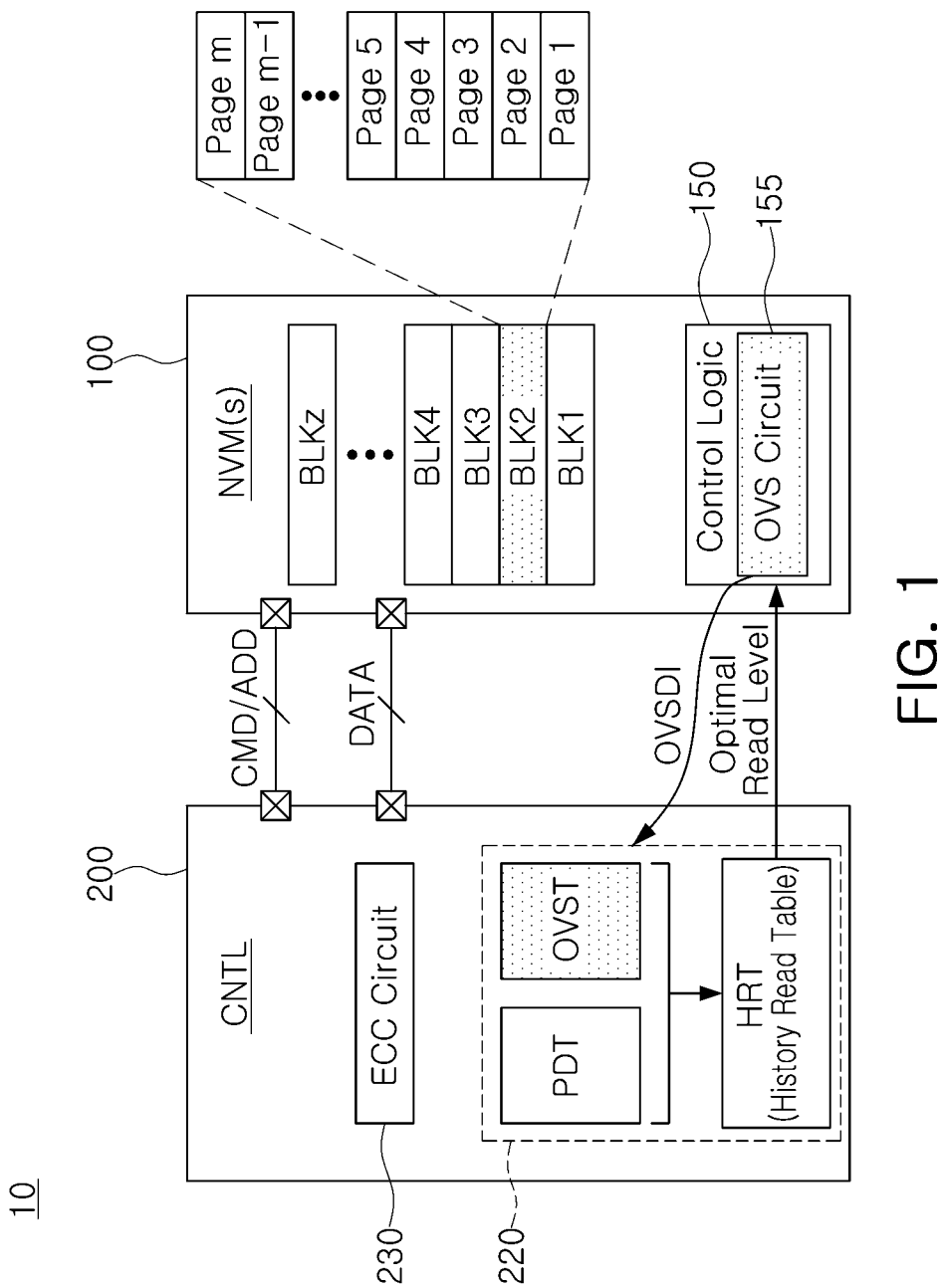
FIG. 1 illustrates a storage device according to an exemplary embodiment of the inventive concept.

Hereinafter, exemplary embodiments of the inventive concept will be described with reference to the accompanying drawings. In the drawing, like reference numerals may refer to like elements.

A controller, a storage device including the controller, and a reading method of the storage device according to an exemplary embodiment of the inventive concept may reflect on-chip valley search (OVS) detection information as an optimal read level to perform a read operation, thereby preventing performance deterioration while securing reliability. FIG. 1 illustrates a storage device 10 according to an exemplary embodiment of the inventive concept. Referring to FIG. 1, the storage device 10 may include at least one nonvolatile memory device (NVM(s)) 100 and a controller (CNTL) 200.

The at least one nonvolatile memory device 100 may store data. The nonvolatile memory device 100 may be a NAND flash memory, a vertical NAND flash memory, a NOR flash memory, a resistive random access memory (RRAM), a phase-change RAM (PRAM), a magnetoresistive RAM (MRAM), a ferroelectric RAM (FRAM), a spin-transfer torque RAM (STT-RAM), or the like. The nonvolatile memory device 100 may be implemented in a three-dimensional array structure. The present inventive concept may be applied to not only a flash memory device, in which a charge storage layer includes a conductive floating gate, but also to a charge trap flash (CTF) in which a charge storage layer includes an insulating layer. Hereinafter, for ease of description, the nonvolatile memory device 100 will be referred to as a vertical NAND flash memory device ("VNAND").

The nonvolatile memory device 100 may include a plurality of memory blocks BLK1 to BLKz (where z is an integer greater than or equal to 2) and a control logic 150.

Each of the plurality of memory blocks BLK1 to BLKz may include a plurality of pages Page 1 to Page m (where m is an integer greater than or equal to 2). Each of the plurality of pages Page 1 to Page m may include a plurality of memory cells. Each of the plurality of memory cells may store at least one bit.

The control logic 150 may receive a command CMD and an address ADD from the controller (CNTL) 200, and may perform an operation corresponding to the received command CMD (e.g., a program operation, a read operation, an erase operation, or the like) on memory cells corresponding to the received address ADD.

The control logic 150 may include an OVS circuit 155. The OVS circuit 155 may perform an on-chip valley search (OVS) operation. The on-chip valley search operation may include a first sensing operation for determining an OVS detection case based on a cell count and a second sensing operation for changing and sensing an actual develop time according to the determined OVS detection case. Details on the on-chip valley search operation are disclosed in U.S. Patent Application Publication Nos. 2020-0286545 and 2020-0098436, and U.S. Pat. Nos. 10,090,046, 10,559,362, 10,607,708, and 10,629,259, the disclosures of which are incorporated by reference herein in their entireties.

The OVS circuit 155 may store OVS detection information OVSDI corresponding to a result of the on-chip valley search operation. Such OVS detection information OVSDI may include information (for example, develop time information) indicating an optimal distribution valley corresponding to a state.

The controller (CNTL) 200 may be connected to at least one nonvolatile memory device 100 through a plurality of control pins transmitting control signals (for example, command latch enable (CLE), address latch enable (ALE), chip enables (CE(s)), write enable (WE), read enable (RE), and the like). In addition, the controller (CNTL) 200 may control the nonvolatile memory device 100 using the control signals (e.g., CLE, ALE, CE(s), WE, RE, and the like). For example, the nonvolatile memory device 100 may latch a command CMD or an address ADD on an edge of a write enable signal WE according to a command latch enable signal CLE and an address latch enable signal ALE to perform program/read/erase operations.

The controller (CNTL) 200 may include a buffer memory 220 and an error correction code (ECC) circuit 230.

The buffer memory 220 may be implemented as a volatile memory (for example, a static random access memory RAM (SRAM), a dynamic RAM (DRAM), a synchronous DRAM (SDRAM), or the like) or a nonvolatile memory (for example, a flash memory, a phase-change RAM (PRAM), a magneto-resistive RAM (MRAM), a resistive RAM (ReRAM), a ferroelectric RAM (FRAM), or the like). The buffer memory 220 may include a plurality of tables such as at least one Pre-Defined Table PDT), an OVS Table (OVST), and a History Read level Table (HRT).

A first table PDT may include first read level offset information. In an exemplary embodiment of the inventive concept, the first table PDT may include first read level offset information corresponding to a program elapsed time. In an exemplary embodiment of the inventive concept, the first table PDT may include first read level offset information corresponding to various pieces of deterioration information (e.g., a temperature, a program/erase cycle, a read cycle, an open word line case, and the like) in addition to the program elapsed time.

A second table OVST may include second read level offset information corresponding to OVS detection information OVSDI. In this case, the OVS detection information OVSDI may be develop time information corresponding to an optimal distribution valley. For example, the second read level offset information may include read level offset information corresponding to develop time information in which an OVS operation is performed. Accordingly, the second table OVST may be a table for converting the OVS detection information OVSDI into read level offset information.

A third table HRT may include third read level offset information associated with a history read operation. In an exemplary embodiment of the inventive concept, the third read level offset information may be determined using the first read level offset information and the second read level offset information. The third read level offset information may include information on an optimal read level at which the history read operation is performed. Details of the history read operation are disclosed in U.S. Pat. Nos. 10,120,589 and 10,373,693, the disclosures of which are incorporated by reference herein in their entireties.

The ECC circuit 230 may generate an error correction code during a program operation and may recover DATA using the error correction code during a read operation. For example, the ECC circuit 230 may generate an error correction code (ECC) to correct a fail bit or an error bit of the DATA received from the nonvolatile memory device 100. The ECC circuit 230 may perform error correction encoding of data, provided to the nonvolatile memory device 100, to generate DATA to which a parity bit is added. The parity bit may be stored in the nonvolatile memory device 100. In addition, the ECC circuit 230 may perform error correction decoding on the DATA output from the nonvolatile memory device 100. The ECC circuit 230 may correct an error using parity. The ECC circuit 230 may correct an error using a low density parity check (LDPC) code, a Bose-Chaudhuri-Hocquenghem (BCH) code, a turbo code, a Reed-Solomon code, a convolution code, a recursive systematic code (RSC), or coded modulation such as trellis-coded modulation (TCM), block coded modulation (BCM), or the like.

When the error correction circuit 230 cannot perform error correction, a read retry operation may be performed. In an exemplary embodiment of the inventive concept, the read retry operation may include an OVS operation. In another exemplary embodiment of the inventive concept, the read retry operation may include an OVS operation reflecting the first table PDT.

The storage device 10 according to an exemplary embodiment of the inventive concept may not perform the OVS operation before an uncorrectable error correction code (UECC) occurs, and may activate the OVS operation after the UECC occurs. The nonvolatile memory device 100 may output OVS detection information OVSDI to the controller 200, and the controller (CNTL) 200 may search a read level offset information corresponding to the OVS detection information OVSDI and may shift a default read level (e.g., a read level of history/normal read operations) with reference to the searched read level offset information during the next read operation.

Figure 2:
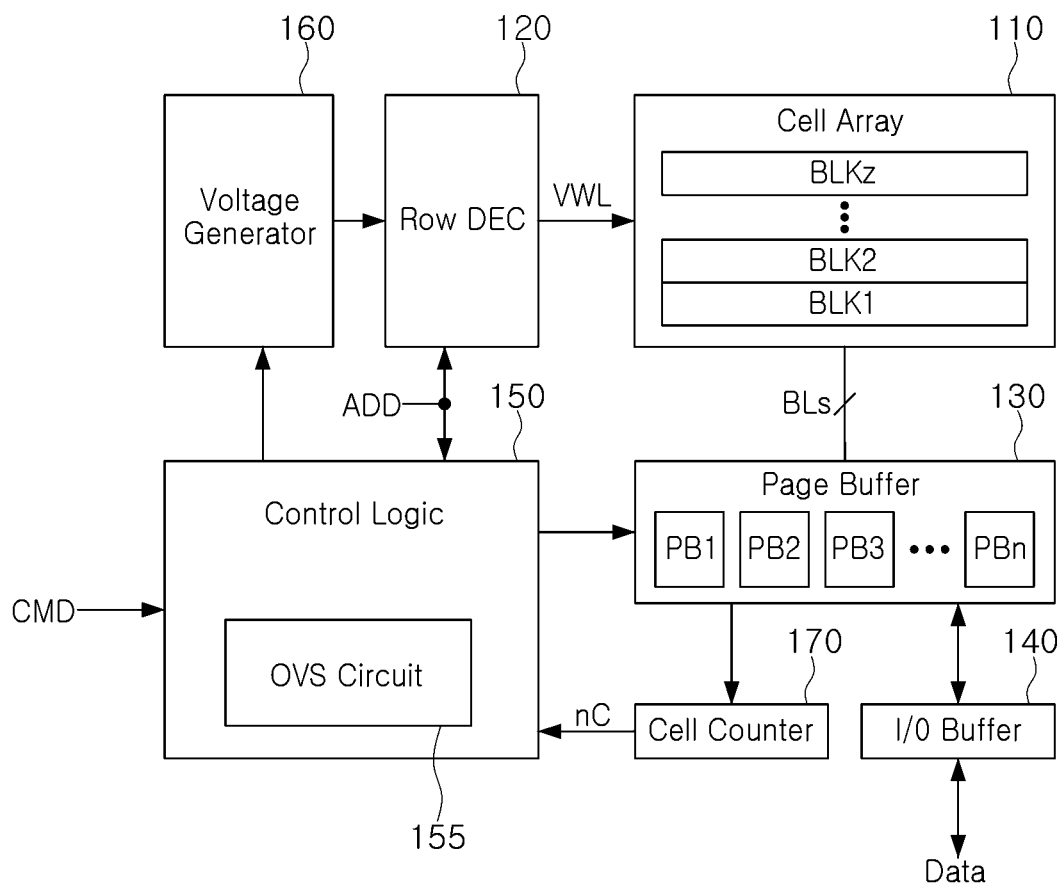
FIG. 2 illustrates an example of a nonvolatile memory device illustrated in FIG. 1.

FIG. 2 illustrates an example of the nonvolatile memory device 100 illustrated in FIG. 1. Referring to FIG. 2, the nonvolatile memory device 100 may include a memory cell array 110, a row decoder 120, a page buffer circuit 130, an input/output (I/O) buffer circuit 140, a control logic 150, a voltage generator 160, and a cell counter 170.

The memory cell array 110 may be connected to the row decoder 120 through word lines WLs or string select and ground select lines SSL and GSL. The memory cell array 110 may be connected to the page buffer circuit 130 through bit lines BLs. The memory cell array 110 may include a plurality of cell strings. A channel of each of the cell strings may be formed in a vertical or horizontal direction. Each of the cell strings may include a plurality of memory cells. The plurality of memory cells may be programmed, erased, or read by a voltage provided to the bit lines BLs or the word lines WLs. In general, a program operation is performed in units of pages and an erase operation is performed in units of blocks.

The row decoder 120 may select one of the memory blocks BLK1 to BLKz of the memory cell array 110 in response to an address ADD. The row decoder 120 may select one word line, among word lines of the selected memory block, in response to the address ADD. The row decoder 120 may transfer a word line voltage VWL, corresponding to an operation mode, to the word line of the selected memory block. During a program operation, the row decoder 120 may apply a programming voltage and a verify voltage to a selected word line and may apply a pass voltage to an unselected word line. During a read operation, the row decoder 120 may apply a read voltage to a selected word line and a read pass voltage to an unselected word line.

The page buffer circuit 130 may operate as a writing driver or a sense amplifier. During a program operation, the page buffer circuit 130 may apply a bit line voltage, corresponding to data to be programmed, to bit lines of the memory cell array 110. During a read operation or a verification operation, the page buffer circuit 130 may detect data stored in a selected memory cell through a bit line BL. A plurality of page buffers PB1 to PBn (where n is an integer greater than or equal to 2), included in the page buffer circuit 130, may each be connected to at least one bit line.

Each of the plurality of page buffers PB1 to PBn may perform sensing and latching operations for performing an OVS operation. For example, each of the plurality of page buffers PB1 to PBn may perform a plurality of sensing operations to identify one state stored in the selected memory cells under the control of the control logic 150. After storing data sensed through a plurality of sensing operations, each of the plurality of page buffers PB1 to PBn may select a certain piece of data under the control of the control logic 150. For example, each of the plurality of page buffers PB1 to PBn may perform a sensing operation two or more times to identify one state. In addition, each of the plurality of page buffers PB1 to PBn may select or output optimal data, among a plurality of pieces of sensed data, under the control of the control logic 150.

The I/O buffer circuit 140 may provide externally provided data to the page buffer circuit 130. The I/O buffer circuit 140 may provide an externally provided command CMD to the control logic 150. The I/O buffer circuit 140 may provide an externally provided address ADD to the control logic 150 or the row decoder 120. In addition, the I/O buffer circuit 140 may output data, sensed and latched by the page buffer circuit 130, to an external entity.

The control logic 150 may control the row decoder 120 and the page buffer circuit 130 in response to an externally transmitted command CMD.

The control logic 150 may include an OVS circuit 155 to perform an OVS operation.

The OVS circuit 155 may control the page buffer circuit 130 and the voltage generator 160 for the OVS operation. The OVS circuit 155 may control the page buffer circuit 130 such that the page buffer circuit 130 performs a sensing operation two or more times to identify a specific state of selected memory cells. The OVS circuit 155 may control the plurality of page buffers PB1 to PBn such that the plurality of page buffers PB1 to PBn store sensing data, corresponding to each of a plurality of sensing results, in a plurality of latch sets included in each of the plurality of page buffers PB1 to PBn. In addition, the OVS circuit 155 may perform processing for selecting optimal data, among a plurality of pieces of sensed data. The OVS circuit 155 may refer to a count result nC, provided from the cell counter 170, to select the optimal data. For example, the OVS circuit 155 may control the page buffer circuit 130 such that the page buffer circuit 130 selects and outputs a read result closest to a distribution valley, among a plurality of sensing results.

In addition, the OVS circuit 155 may store develop time information corresponding to the OVS operation. The OVS circuit 155 may output the stored develop time information to the controller 200, as OVS detection information OVSDI. In an exemplary embodiment of the inventive concept, the OVS detection information OVSDI may be output using a universe internal bus (UIB) out, or may be output in response to a get feature command, or may be output in response to a status read command. For ease of description, the following description will be given for a case in which the OVS detection information OVSDI is output in response to the get feature command.

The voltage generator 160 may generate various types of word line voltages to be applied to each word line under the control of the control logic 150 and a well voltage to be supplied to a bulk (for example, a well region) in which memory cells are formed. Word line voltages, respectively applied to word lines, may include a programming voltage, a pass voltage, a read voltage, and a read pass voltage, and the like.

The cell counter 170 may count memory cells, corresponding to a specific threshold voltage range, from data sensed by the page buffer circuit 130. For example, the cell counter 170 may process data, sensed by each of the plurality of page buffers PB1 to PBn, to count the number of memory cells having a threshold voltage within a specific threshold voltage range.

The nonvolatile memory device 100 according to an exemplary embodiment of the inventive concept may perform an OVS operation to secure reliability of a read operation. In addition, the nonvolatile memory device 100 according to an exemplary embodiment of the inventive concept may output OVS detection information OVSDI to the controller 200 to perform a read operation at an optimal read level in the next read operation. Accordingly, an occurrence of UECC of the read operation may be reduced. As a result, a read retry operation for data recovery may be reduced.

Figure 3:
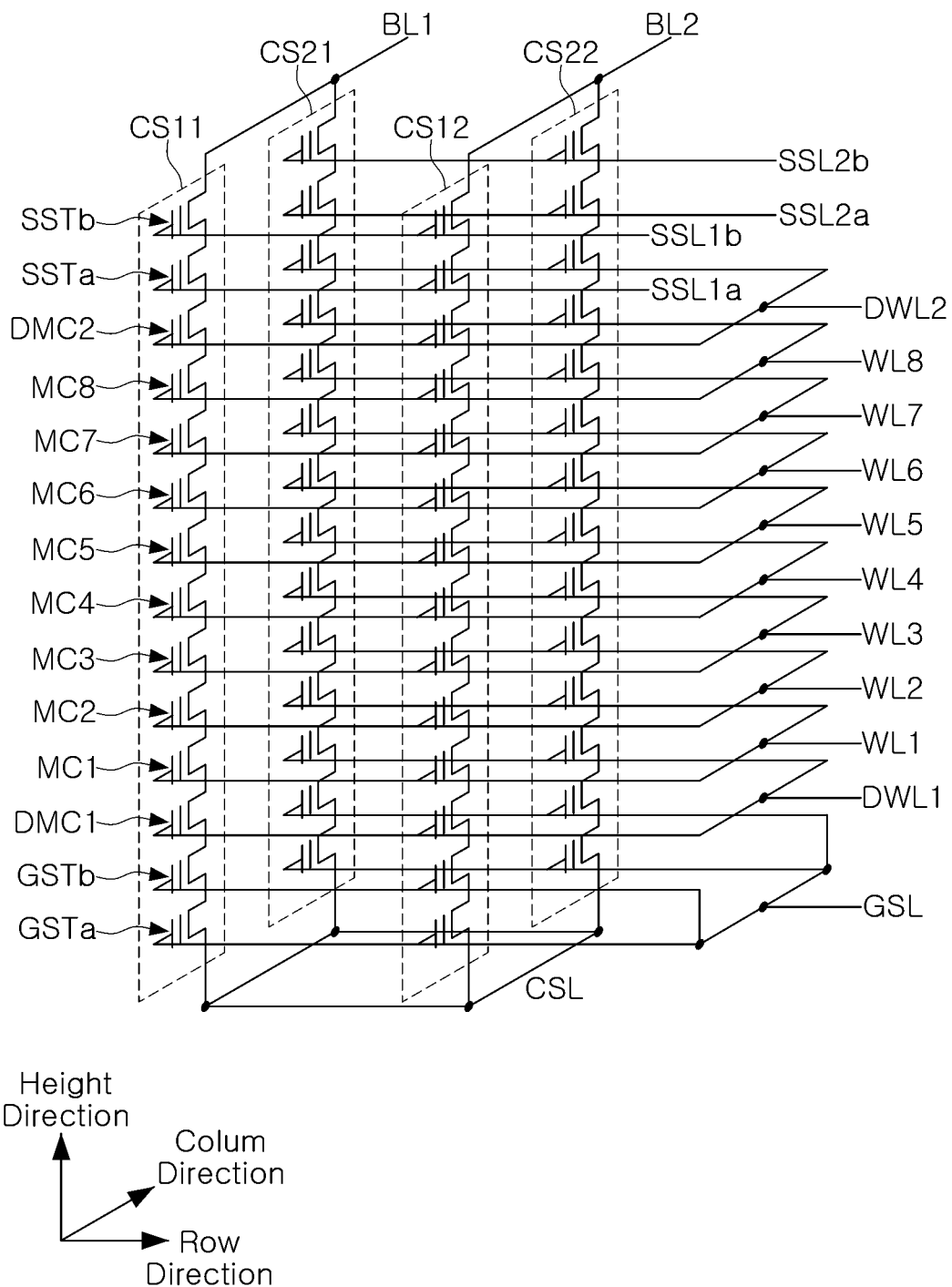
FIG. 3 is a circuit diagram of one memory block, among memory blocks illustrated in FIG. 1.

FIG. 3 is a circuit diagram of one memory block BLK1, among memory blocks illustrated in FIG. 1. The memory block BLK1, illustrated in FIG. 3, has a three-dimensional structure. The memory block BLK1 may include a plurality of cell strings CS11, CS12, CS21, and CS22. The plurality of cell strings CS11, CS12, CS21, and CS22 may be disposed in a row direction and a column direction to form rows and columns.

In an exemplary embodiment of the inventive concept, the cell strings CS11 and CS12 may be connected to string select lines SSL1a and SSL1b to form a first row. The cell strings CS21 and CS22 may be connected to string select lines SSL2a and SSL2b to form a second row. For example, the cell strings CS11 and CS21 may be connected to a first bit line BL1 to form a first column. The cell strings CS12 and CS22 may be connected to a second bit line BL2 to form a second column.

Each of the plurality of cell strings CS11, CS12, CS21, and CS22 may include a plurality of cell transistors. For example, each of the plurality of cell strings CS11, CS12, CS21, CS22 may include string select transistors SSTa and SSTb, a plurality of memory cells MC1, MC2, MC3, MC4, MC5, MC6, MC7 and MC8, ground select transistors GSTa and GSTb, and dummy memory cells DMC1 and DMC2. For example, each of a plurality of cell transistors, included in the plurality of cell strings CS11, CS12, CS21, and CS22, may be a charge trap flash (CTF) memory cell.

The plurality of memory cells MC1 to MC8 may be connected in series and may be stacked in a height direction, perpendicular to a plane defined by a row direction and a column direction. The plurality of memory cells MC1 to MC8 may be connected to a plurality of word lines WL1, WL2, WL3, WL4, WL5, WL6, WL7 and WL8. The string select transistors SSTa and SSTb may be connected in series. The string select transistors SSTa and SSTb, connected in series, may be provided between the plurality of memory cells MC1 to MC8 and the first or second bit lines BL1 and BL2. The ground select transistors GSTa and GSTb may be connected in series. The ground select transistors GSTa and GSTb, connected in series, may be provided between the plurality of memory cells MC1 to MC8 and a common source line CSL.

In an exemplary embodiment of the inventive concept, a first dummy memory cell DMC1 may be provided between the plurality of memory cells MC1 to MC8 and the ground select transistors GSTa and GSTb. For example, the first dummy memory cell DMC1 may be disposed between the first memory cell MC1 and the ground select transistor GSTb. For example, a second dummy memory cell DMC2 may be provided between the plurality of memory cells MC1 to MC8 and the string select transistors SSTa and SSTb.

The ground select transistors GSTa and GSTb of the cell strings CS11, CS12, CS21, and CS22 may be commonly connected to a ground select line GSL. For example, ground select transistors of the same row may be connected to the same ground select line, and ground select transistors of different rows may be connected to different ground select lines. For example, first ground select transistors GSTa of the cell strings CS11 and CS12 of a first row may be connected to a first ground select line. Similarly, among second string select transistors SSTb having the same height, string select transistors of the same row may be connected to the same string select line, and string select transistors of different rows may be connected to different string select lines. For example, second string select transistors SSTb of the cell strings CS11 and CS12 of a first row may be commonly connected to a string select line SSL1b, and second string select transistors SSTb of cell strings CS21 and CS22 of a second row may be commonly connected to a string select line SSL2b.

In addition, string select transistors of cell strings of the same row may be commonly connected to the same string select line. For example, first and second string select transistors SSTa and SSTb of the cell strings CS11 and CS12 of the first row may be commonly connected to the same string selection line. First and second string select transistors SSTa and SSTb of the cell strings CS21 and CS22 of the second row may be commonly connected to the same string select line.

In an exemplary embodiment of the inventive concept, dummy memory cells having the same height may be connected to the same dummy word line, and dummy memory cells having different heights may be connected to different dummy word lines. For example, first dummy memory cells DMC1 may be connected to a first dummy word line DWL1, and second dummy memory cells DMC2 may be connected to a second dummy word line DWL2.

In the first memory block BLK1, an erase operation may be performed in units of memory blocks or sub-blocks. When an erase operation is performed in units of memory blocks, all memory cells MC of the first memory block BLK1 may be simultaneously erased in response to a single erase request. When an erase operation is performed in units of sub-blocks, some of the memory cells MC of the first memory block BLK1 may be simultaneously erased in response to a single erase request, and the other memory cells MC may be erase-inhibited. A low voltage (for example, a ground voltage) may be supplied to a word line connected to the erased memory cells, and a word line connected to the erase-inhibited memory cells may be floated.

The first memory block BLK1, illustrated in FIG. 3, is an exemplary memory block. In an exemplary embodiment of the present inventive concept, it will be understood that the number of lines GSL, WL, DWL, SSL, and the like, connected to cell transistors GST, MC, DMC, SST, is not limited according to the number of cell strings, the number of rows, the number of columns, the number of cell transistors GST, MC, DMC, SST, and the like.

In general, an OVS operation is only used for entry of a recovery code to satisfy read timing (for example, tR) conditions of a nonvolatile memory device. However, in an existing defense code, the OVS operation encounters an issue such as use of an optimal read level.

Figure 4:
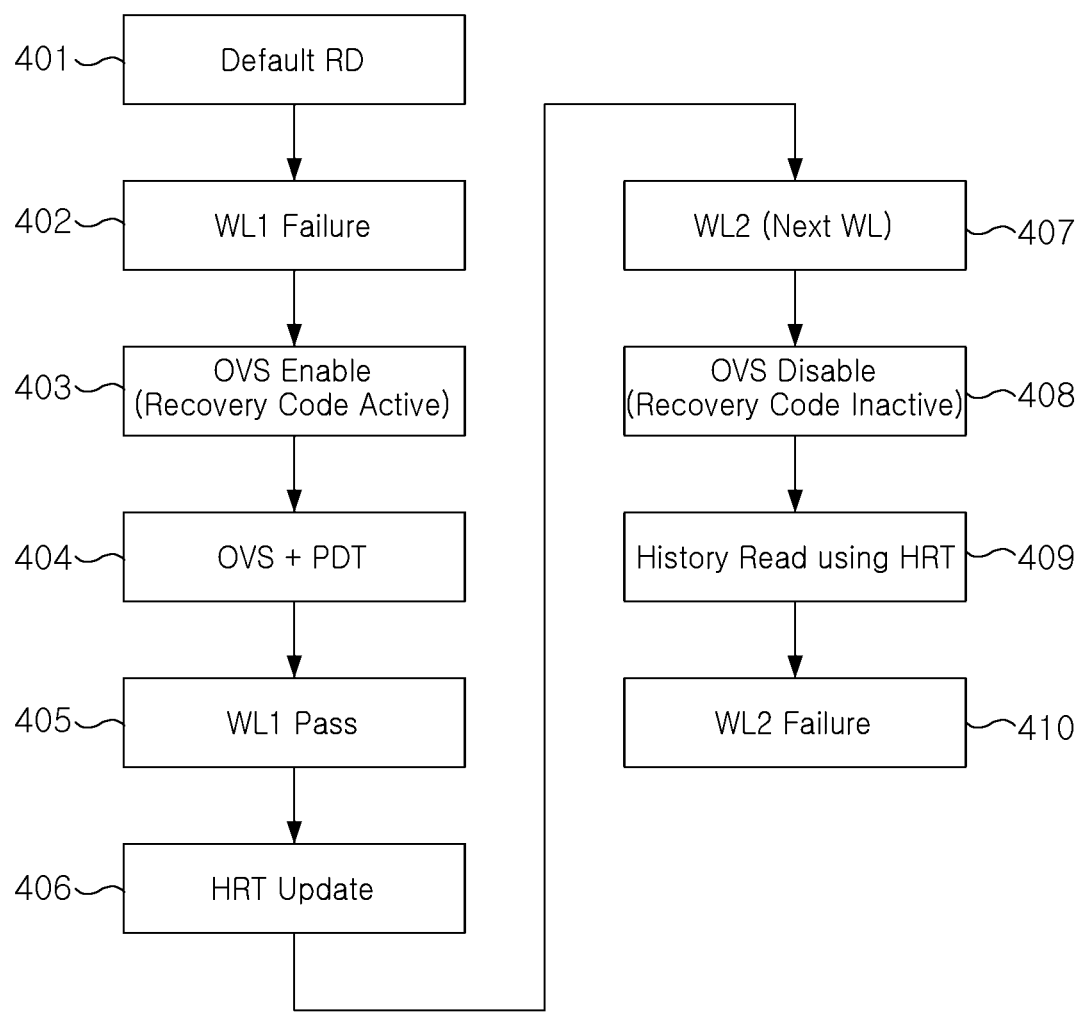
FIG. 4 is a flowchart illustrating a read operation performed using an on-chip valley search (OVS) in a general storage device.

FIG. 4 is a flowchart illustrating a read operation performed using OVS in a general storage device. It will be assumed that a read operation is performed on memory cells connected to a first word line WL1 using a default read level (401). When such a read operation fails (402), the OVS operation performed on the memory cells connected to the first word line WL1 is activated (403). For example, a nonvolatile memory device enters a defense code. The OVS operation is performed by reflecting a pre-defined table PDT (404). When the read operation performed on the memory cells connected to the first word line WL1 passes due to the OVS operation (405), a history read level table HRT is updated (406). In this case, offset information of the PDT used for the OVS operation is updated to the HRT.

Then, when a read operation is performed on memory cells connected to the next word line (407), for example, a second word line WL2, the OVS operation is basically deactivated. For example, a read operation is performed on the memory cells connected to the second word line WL2 while releasing the defense code (408). In this case, a history read operation is performed using the updated HRT (409). A general storage device does not reflect an optimal read level offset, searched in an OVS operation, in an HRT. Therefore, there is a high probability that a read operation of the memory cells connected to the next word line will fail (410).

The storage device 10 according to an exemplary embodiment of the inventive concept may reflect detection information OVSDI (see FIG. 1), based on the OVS operation, in a history read level table HRT to use an optimal read level in the next read operation.

Figure 5:
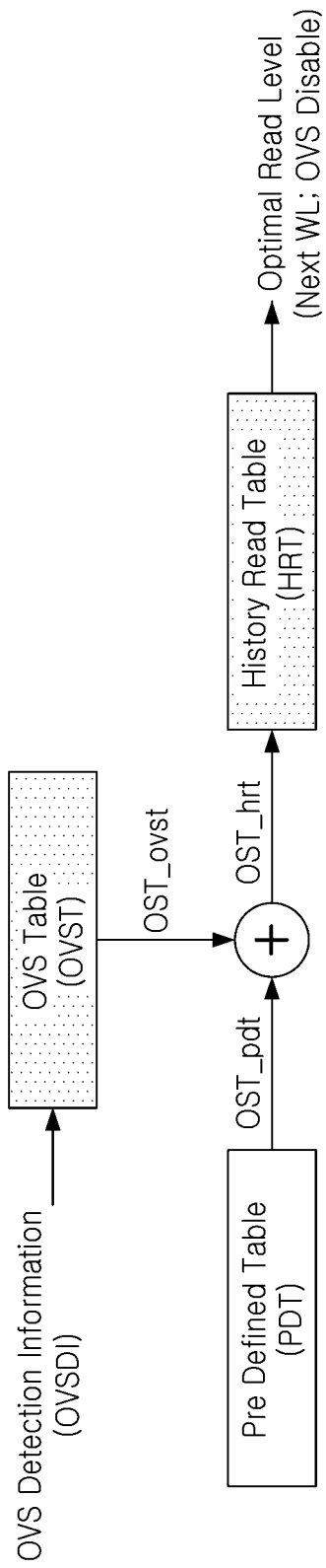
FIG. 5 is a diagram illustrating extraction of an optimum read level of a storage device according to an exemplary embodiment of the inventive concept.

FIG. 5 is a diagram illustrating extraction of an optimum read level of a storage device 10 according to an exemplary embodiment of the inventive concept. Referring to FIG. 5, the storage device 10 may update the history read level table HRT (a third table) using a pre-defined table PDT (a first table) and an OVST (a second table) to extract an optimal read level. In other words, the storage device 10 may update the history read level table HRT using a first table and a second table to extract an optimal read level.

The OVS detection information OVSDI (see FIG. 1) may include result information based on an OVS operation. A second read level offset OST_ovst, corresponding to the OVS detection information OVSDI, may be reflected in the OVST. In other words, the second read level offset OST_ovst may be output from the second table. The second read level offset OST_ovst may be added to a first read level offset OST_pdt depending on lapse of a program time to determine a third read level offset OST_hrt. The first read level offset OST_pdt may be output from the first table. The third read level offset OST_hrt may not be determined only by a simple addition of the first read level offset OST_pdt and the second read level offset OST_ovst. For example, the third read level offset OST_hrt may be added by applying a weight to each of the first and second read level offsets OST_pdt and OST_ovst. The third read level offset OST_hrt may be stored in the third table.

The storage device 10 according to an exemplary embodiment of the inventive concept may reflect the second read level offset OST_ovst, based on an OVS operation, in an HRT to perform a read operation at an optimal read level while deactivating the OVS operation (for example, without applying a defense code). Thus, data reliability of the read operation may be increased and entry of the defense code may be reduced to increase performance of the read operation.

In general, memory cells distributed around a distribution valley are memory cells disposed on a boundary between an ON-cell and an OFF-cell. Therefore, identification of an ON-cell or an OFF-cell for such cells may vary depending on a develop time. For example, when the develop time is slightly decreased, memory cells distributed around the distribution valley may be identified as OFF-cells. Further, when the develop time is slightly increased, the memory cells distributed around the distribution valley may be identified as ON-cells. For example, in a read operation, decreasing a develop time for memory cells having a threshold voltage of a level similar to a level of a read voltage applied to a word line may have an effect of increasing the read voltage to perform a sensing operation. Further, in a read operation, increasing a develop time for memory cells having a threshold voltage around a read voltage has an effect of decreasing the read voltage to perform a sensing operation. Therefore, sensing a sensing node of a page buffer several times at different develop times may have an effect of varying a word line voltage to precharge and sense a bitline. For example, a sensing operation at different develop times has the same effect as read voltages having different levels supplied to a word line.

Figure 6A:
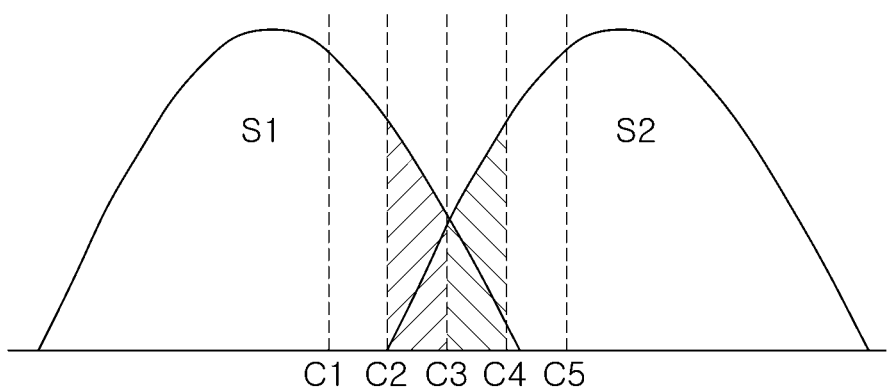
FIGS. 6A and 6B are diagrams illustrating different read voltages of a distribution valley and corresponding develop times.
Figure 6B:
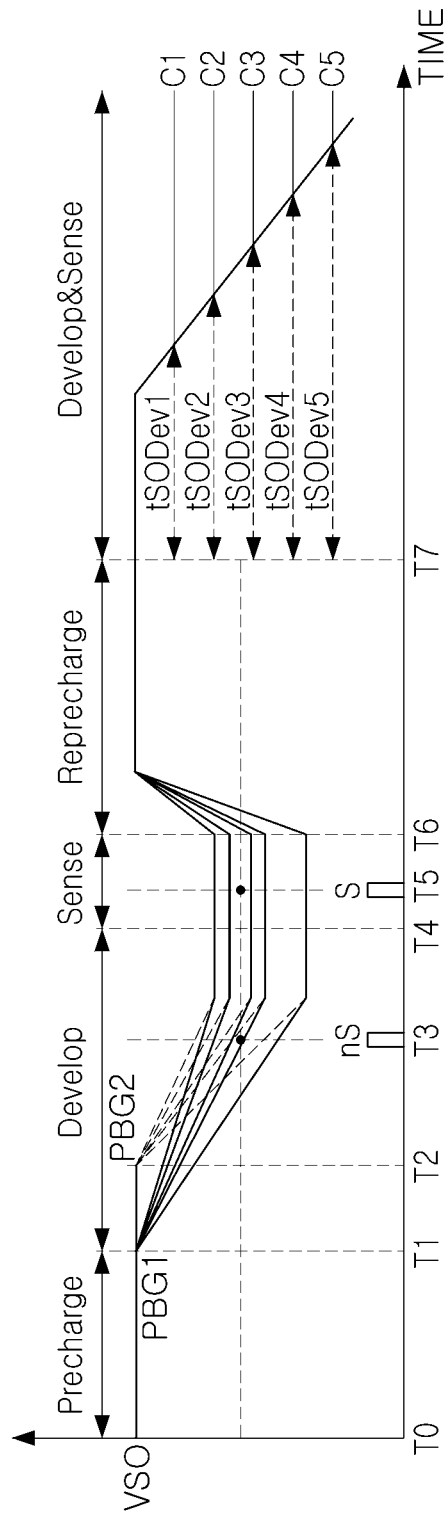

FIGS. 6A and 6B are diagrams illustrating different read voltages of a distribution valley and corresponding develop times. As illustrated in FIG. 6A, an OVS operation for searching distribution valleys of states S1 and S2 may be performed by a plurality of sensing operations. The plurality of sensing operations may be simultaneously performed in each of a plurality of page buffer groups.

Referring to FIG. 6B, an OVS operation may be performed in such manner that first page buffers PGB1 and second page buffers PGB2 sequentially latch sensing nodes at the same point in time during different develop periods to store a sensing result.

A precharge operation may be performed from a point in time T0 to a point in time T1. A first bit line and a first sensing node, connected to each of the first page buffers PBG1, may be charged to perform the precharge operation. When bit line set-up signals are activated, the sensing node and the first bit line may be precharged to a specific level. When a first bit line set-up signal is deactivated to a high level at a point in time T1, a precharge circuit of each of the first page buffers PBG1 may be turned off. In addition, when a second bit line set-up signal is deactivated to a high level at a point in time T2 subsequent to the point in time T1, a precharge circuit of each of the second page buffers PBG2 may be turned off. In this case, a level of a sensing node of each of the first page buffers PBG1 and a level of a sensing node of each of the second page buffers PBG2 may vary with the intensity of current flowing to a corresponding bit line depending on whether a memory cell is turned on or off.

As illustrated in FIG. 6B, each of the first page buffers PBG1 may precharge a sensing node from a point in time T0 to a point in time T1, and may develop the first bit lines from the point in time T1 to a point in time T4. Each of the second page buffers PBG2 may precharge a sensing node from the point in time T0 to the point in time T1, and may develop the second bit lines from a point in time T2 to the point in time T4, wherein the point in time T2 is later than the point in time T.

A first sensing operation may include a latch reset (nS) sensing operation performed at a point in time T3 and a latch set (S) sensing operation performed at a point in time T5. First cell count information may be calculated using ON-cell count values of the latch reset (nS) sensing operation and the latch set (S) sensing operation in the first page buffers PGB1. In addition, second cell count information may be calculated using ON-cell count values of the latch reset (nS) sensing operation and the latch set (S) sensing operation in the second page buffers PGB2. A detection case (one of C1, C2, C3, C4 and C5) corresponding to an optimal read level corresponding to a distribution valley may be determined based on the first cell count information and the second cell count information of the first sensing operation. A develop time tSODev1, tSODev2, tSODev3, tSODev4 and tSODev5 of the second sensing operation, corresponding to the determined detection case, may be determined. A point in time T6 to a point in time T7 may correspond to a recharge operation and develop and sense operations may be performed from the point in time T7.

FIG. 7 is a diagram illustrating read level offset compensation using an OVST according to an exemplary embodiment of the inventive concept.

An offset of a develop time, corresponding to an optimal distribution valley based on an OVS operation, may be determined. In the case of an uppermost page, the offset of the develop time is +80 ns. In this case, a detection case of the OVS operation corresponds to a third detection case C3 (case 3 in FIG. 7). The OVS circuit 155 (see FIG. 1) of the nonvolatile memory device 100 (see FIG. 1) may perform a first conversion operation on a detection case corresponding to an optimal develop time of the OVS operation. The OVS circuit 155 may store or latch data bits for each detection case.

Then, OVS detection information OVSDI (see FIG. 1) from the nonvolatile memory device 100 may be output to the controller 200 (see FIG. 1). The controller 200 may search a read level offset (+20 mV) corresponding to the OVS detection information, for example, the OVS detection case C3 in the OVST. In this case, the controller 200 may perform a second conversion operation on a read level corresponding to the OVS detection case. Ultimately, the controller 200 may compensate default/history read level using the OVST. It is to be understood that if the OVS detection case was C1 or case 1, the read level offset would be −20 mV, for example.

FIGS. 8A and 8B illustrate an OVST according to an exemplary embodiment of the inventive concept.

Referring to FIG. 8A, eight states S1, S2, S3, S4, S5, S6, S7 and S8 corresponding to s 3-bit memory cell and seven read levels R1, R2, R3, R4, R5, R6 and R7 for distinguishing the states S1 to S8 are illustrated. Referring to FIG. 8B, OVST includes offsets for detection cases C1 to C5 corresponding to the seven read levels R1 to R7.

Although five OVS detection cases are illustrated in FIG. 8B, it will be understood that the number of detection cases according to the present embodiment is not limited thereto.

Figure 9A:
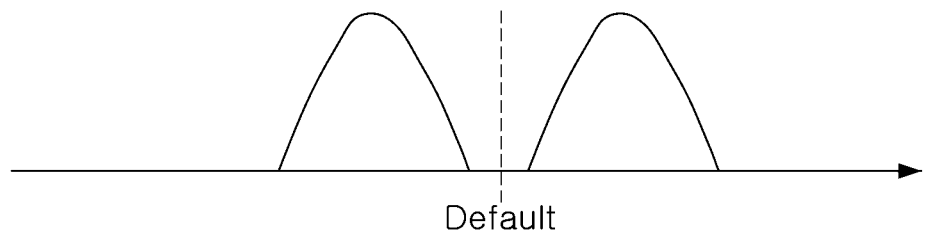
FIGS. 9A, 9B, and 9C illustrate an example of searching an optimal valley using an OVST according to an exemplary embodiment of the inventive concept when a pre-defined table (PDT) offset is deficient.
Figure 9B:
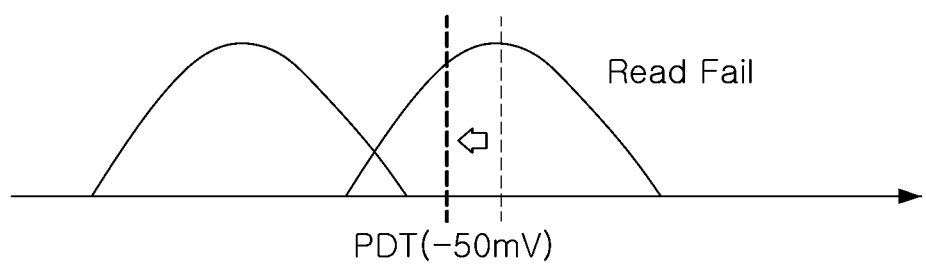
Figure 9C:
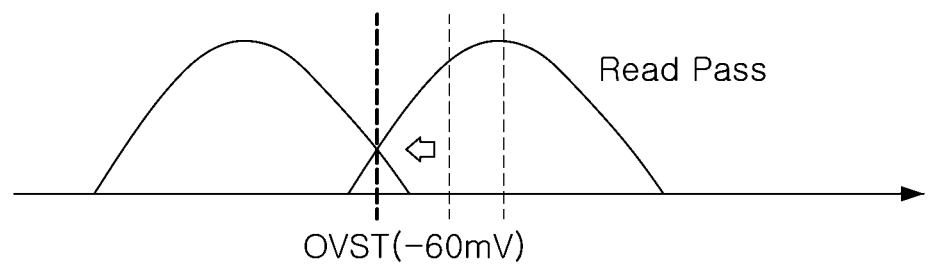

FIGS. 9A, 9B, and 9C illustrate an example of searching an optimal valley using an OVST according to an exemplary embodiment of the inventive concept when a pre-defined table PDT offset is deficient.

Referring to FIG. 9A, it is be assumed that a memory cell deteriorates more than a PDT offset (for example, −50 mV). Under the assumption, as illustrated in FIG. 9B, a read operation using only an existing PDT offset (−50 mV) has high read-failure probability. In addition, as illustrated in FIG. 9C, an optimal read offset (−110 mV), obtained by adding an OVST offset (−60 mV) to the existing PDT offset (−50 mV), may be reflected to perform a read operation according to an exemplary embodiment of the present inventive concept in an optimal distribution valley. As a result, the read operation may have high read-pass probability.

Figure 10A:
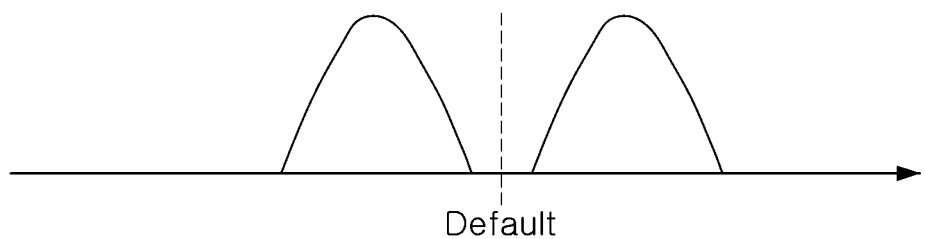
FIGS. 10A, 10B, and 10C illustrate an example of searching an optimal valley using an OVST according to an exemplary embodiment of the inventive concept when a PDT offset is excessive.
Figure 10B:
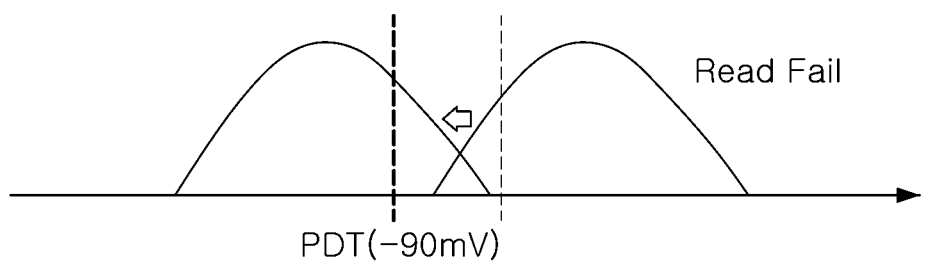
Figure 10C:
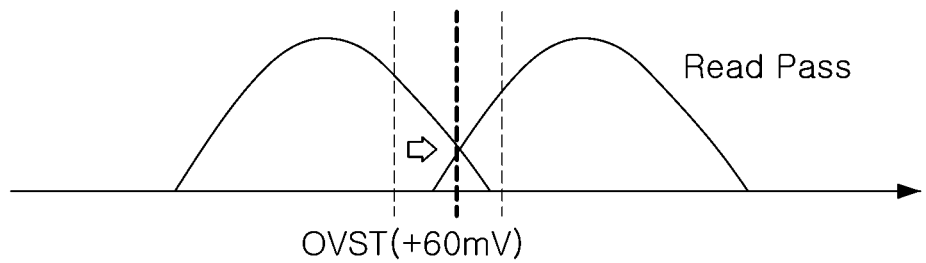

FIGS. 10A, 10B, and 10C illustrate an example of searching an optimal valley using an OVST according to an exemplary embodiment of the inventive concept when a PDT offset is excessive. Referring to FIG. 10A, it is assumed that a memory cell deteriorate less than a PDT offset (for example, −90 mV). Under the assumption, as illustrated in FIG. 10B, a read operation using only an existing PDT offset (−90 mV) has high read-failure probability. In addition, as illustrated in FIG. 10C, an optimal read offset (−30 mV), obtained by adding an OVST offset (+60 mV) to the existing PDT offset (−90 mV), may be reflected to perform a read operation according to an exemplary embodiment of the present inventive concept in an optimal distribution valley. As a result, the read operation has high read-pass probability.

The offset compensation methods, illustrated in FIGS. 9C and 10C, are not intended to limit the present inventive concept.

The read operation of the nonvolatile memory device 100 according to an exemplary embodiment of the inventive concept may be performed in a normal mode or an OVS mode. The OVS mode may be applied to at least one state.

Figure 11A:
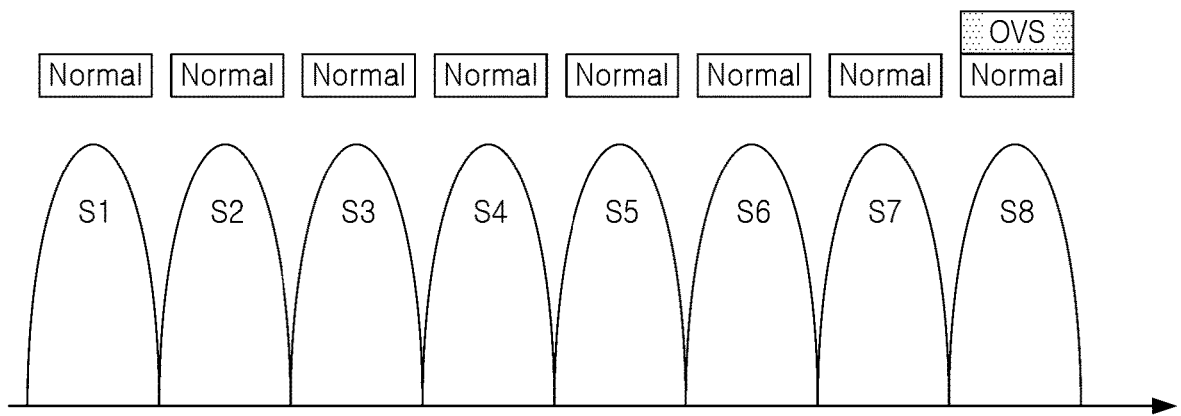
FIG. 11A illustrates an example of a distribution to which an OVS mode of a read operation according to an exemplary embodiment of the inventive concept is applied.

FIG. 11A illustrates an example of a distribution to which an OVS mode of a read operation according to an exemplary embodiment of the inventive concept is applied.

Referring to FIG. 11A, an OVS operation may be applied to only a highest state (for example, S8). It should be understood that a state, to which the OVS operation is applied, is not limited to the highest state S8.

Figure 11B:
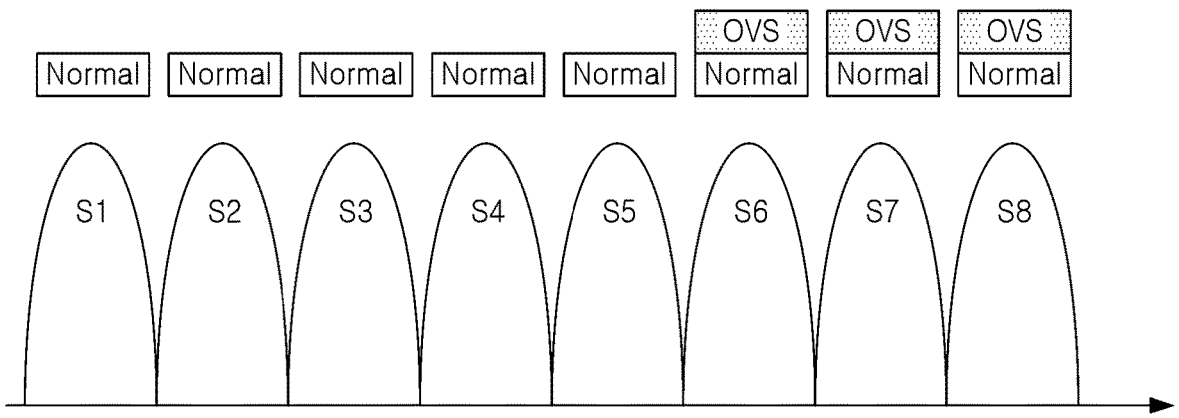
FIG. 11B illustrate an example of distributions to which an OVS mode of a read operation according to another exemplary embodiment of the inventive concept is applied.

FIG. 11B illustrates an example distribution to which an OVS mode of a read operation according to another exemplary embodiment of the inventive concept is applied.

Referring to FIG. 11B, the OVS operation may be applied to some of the states (for example, S6, S7, and S8). The three states, to which the OVS operation is applied, are illustrated in FIG. 11B, but the present inventive concept is not limited thereto.

Figure 11C:
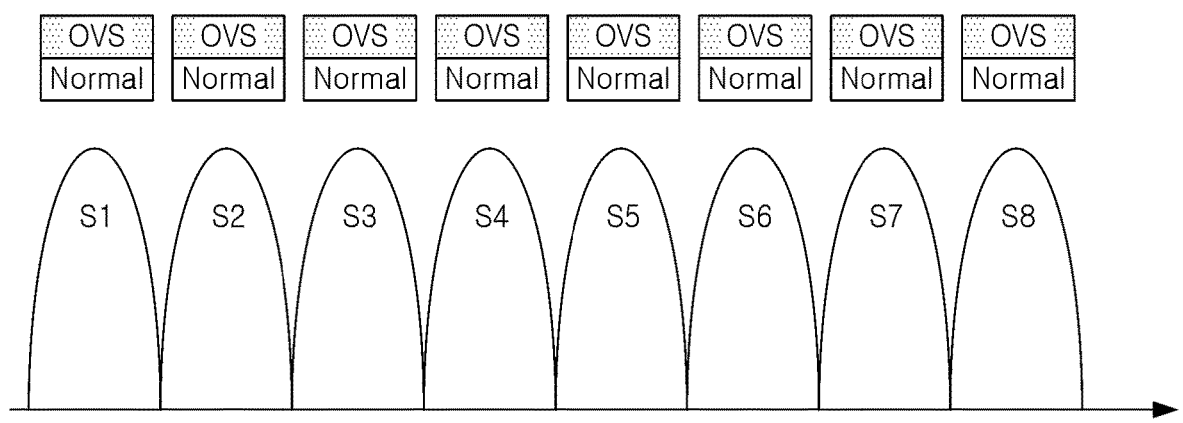
FIG. 11C illustrates an example of distributions to which an OVS mode of a read operation according to another exemplary embodiment of the inventive concept is applied.

FIG. 11C illustrates an example of distributions to which an OVS mode of a read operation according to another exemplary embodiment of the inventive concept is applied. Referring to FIG. 11C, the OVS operation may be applied all states (for example, S1 to S8).

In FIGS. 11A, 11B, and 11C, the application of the OVS mode to states of a 3-bit memory cell (a triple-level cell (TLC)) has been described. However, a memory cell according to an exemplary embodiment of the present inventive concept is not limited to a TLC. A memory cell according to an exemplary embodiment of the present inventive concept may be a 4-bit memory cell (a quadruple-level cell (QLC)). In this case, the OVS mode may be applied to at least one state, among 16 states.

Figure 12:
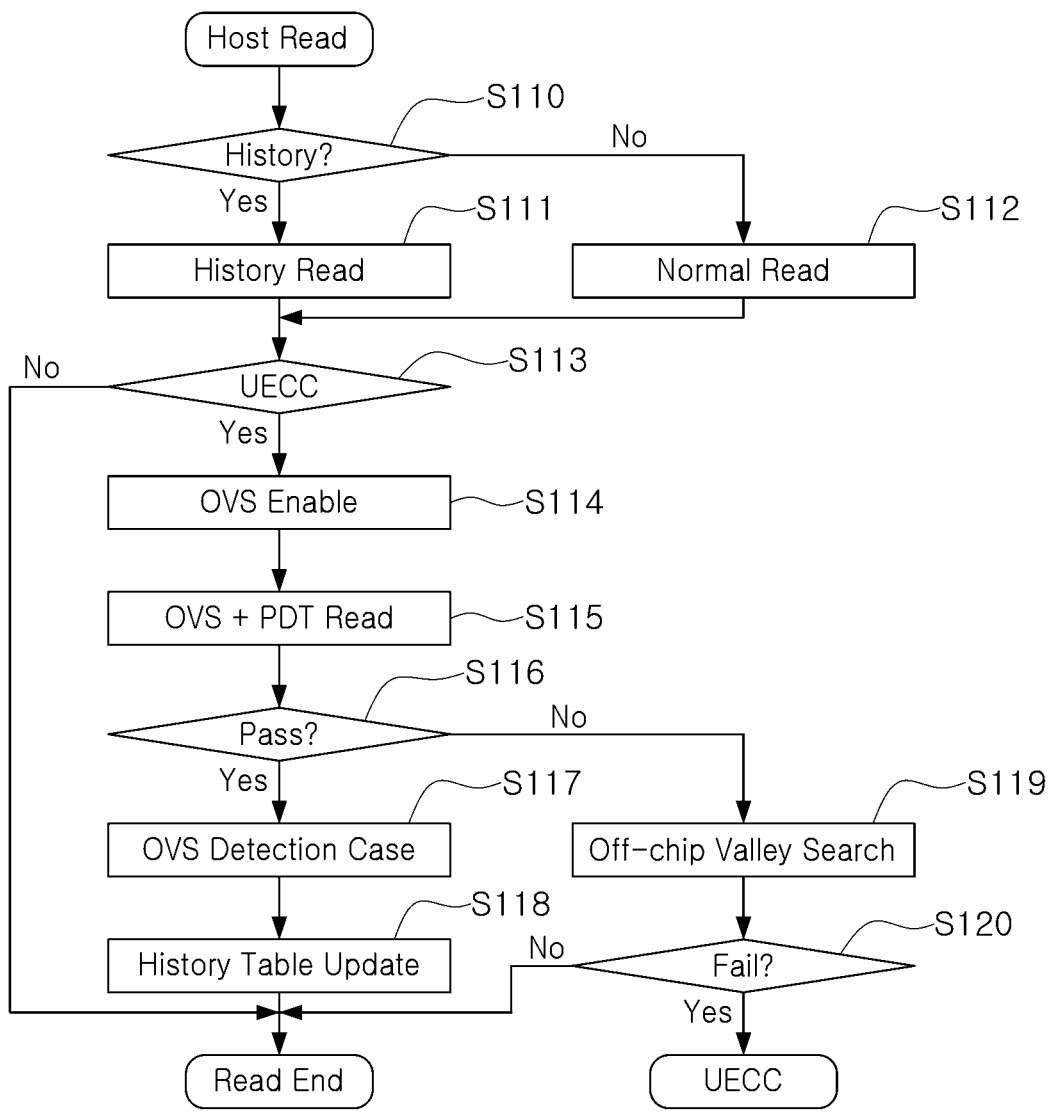
FIG. 12 is a flowchart illustrating a reading method of a storage device according to an exemplary embodiment of the inventive concept.

FIG. 12 is a flowchart illustrating a reading method of a storage device according to an exemplary embodiment of the inventive concept. Referring to FIGS. 1 to 12, a read operation of the storage device 10 will be performed, as follows.

The storage device 10 may receive a reading request from a host (e.g., the read request may be externally provided from the host). The storage device 10 may identify a history of such a reading request. A checking may be made as to whether there was a currently received reading request in a history buffer (S110). When there is a currently received reading request among previous reading requests stored in the history buffer, a history read operation may be performed (S111). In this case, the history read operation may be performed at an optimum read level included in a history read level table HRT. When there is no current reading request among the previous reading requests stored in the history buffer, a normal read operation may be performed (S112). In this case, the normal read operation may be performed at a default read level.

As a result of the history read operation or the normal read operation, a determination may be made as to whether UECC occurs (S113). The UECC means that read data cannot be recovered by the ECC circuit 230 (see FIG. 1). When the UECC does not occur, the read operation may be finished immediately. When the UECC occurs, an OVS mode is activated (S114) and the nonvolatile memory device 100 (see FIG. 1) may perform a read retry operation according to the OVS mode. The read retry operation may include a read operation using a PDT and OVS. For example, a read level offset of the PDT and an OVS operation may be performed to perform the read retry operation (S115).

A determination may be made as to whether the read retry operation passes (S116). As a result of the determination, offset information corresponding to an OVS detection case may be determined using an OVST when the read retry operation passes (S117). A history read level table HRT, in which offset information of the OVST and offset information of the PDT are reflected, may be updated (S118). The update of the history read level table HRT may be performed periodically or non-periodically.

When the read retry operation fails, the controller 200 may perform an off-chip valley search operation to recover data (S119). The off-chip valley search means that a distribution valley is searched by sequentially scanning a predetermined voltage period while increasing or decreasing the predetermined voltage period by a predetermined voltage.

A read operation may be performed according to the distribution valley based on to the off-chip valley search operation, and a determination may be made as to whether the read operation fails (S120). When the read operation does not fail, the read operation may be finished. When the read operation fails, UECC for a reading request from a host may occur. The UECC may be output to the host.

The read operation of the nonvolatile memory device 100 according to an exemplary embodiment of the inventive concept may include a first read operation, performed according to a first read command, and a second read operation performed according to a second read command. The nonvolatile memory device 100 may perform a read operation using a default read level in response to the first read command, and may perform an OVS operation in response to the second read command.

In an exemplary embodiment of the inventive concept, a time of the second read operation may be longer than a time of the first read operation. In another exemplary embodiment of the inventive concept, the time of the second read operation may be the same as the time of the first read operation.

Figure 13:
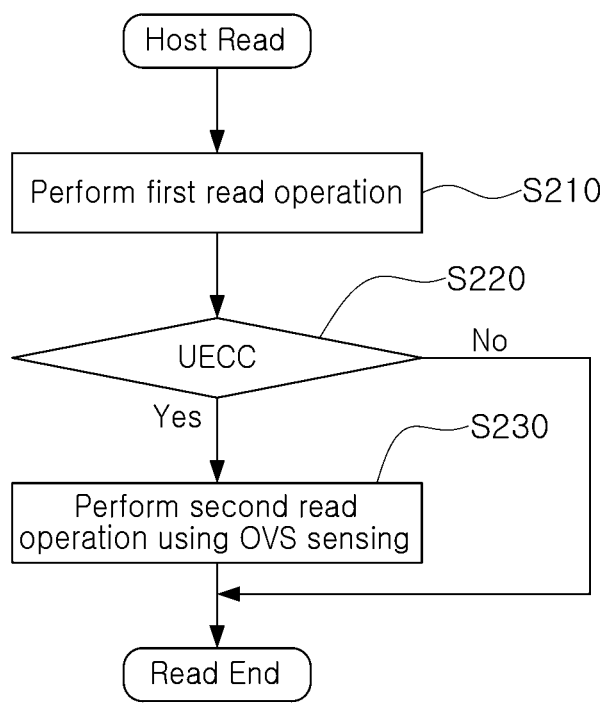
FIG. 13 is a flowchart illustrating a reading method of a storage device according to another exemplary embodiment of the inventive concept.

FIG. 13 is a flowchart illustrating a reading method of a storage device according to another exemplary embodiment of the inventive concept. Referring to FIGS. 1 to 11 and FIG. 13, a read operation of the storage device 10 may be performed as follows.

The nonvolatile memory device 100 (see FIG. 1) may perform a first read operation using a default read level in response to a first command transmitted from the controller 200 (see FIG. 1) (S210). Information corresponding to the default read level may be transmitted from the controller 200 together with the first command. Default read level information may include optimal read level offset information of a history read level table HRT.

The controller 200 may determine whether UECC occurs, as a result of the first read operation (S220). When the UECC did not occur, the read operation may be finished.

When the UECC occurs, the nonvolatile memory device 100 may perform a second read operation using OVS sensing in response to the second command transmitted from the controller 200. Thus, the read operation may be finished.

Figure 14:
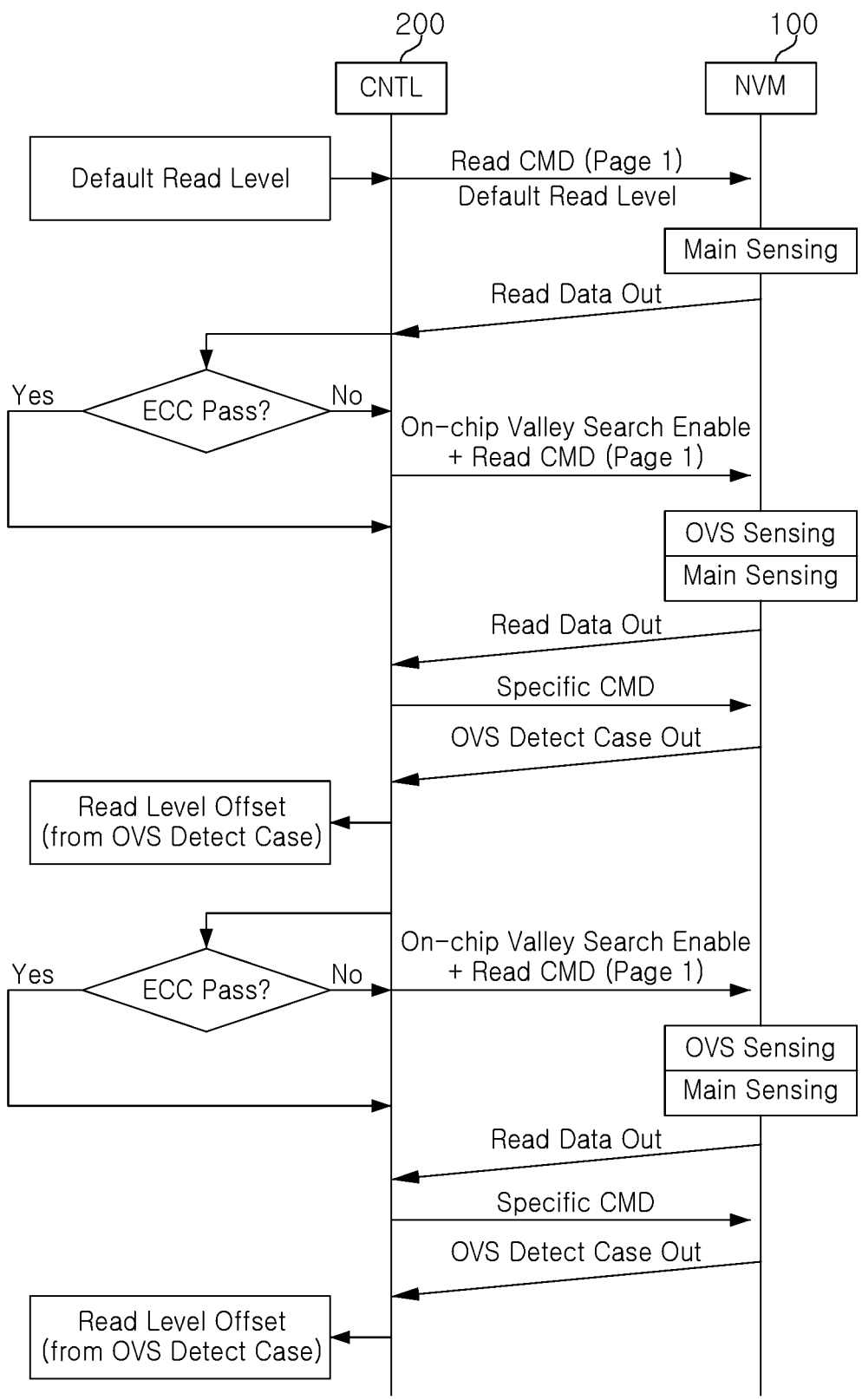
FIG. 14 is a ladder diagram illustrating a process of extracting a read level offset from the storage device according to an exemplary embodiment of the inventive concept.

FIG. 14 is a ladder diagram illustrating a process of extracting a read level offset from the storage device 10 according to an exemplary embodiment of the inventive concept. Referring to FIGS. 1 to 14, the read operation of the storage device 10 may be performed as follows.

A default read level corresponding to a host or an internal reading request may be determined. In an exemplary embodiment of the inventive concept, in the case of a history read operation, the default read level may be determined using read level offset information of an HRT. The controller 200 may transmit a default read level to the nonvolatile memory device 100 together with a first read command for a Page 1. The nonvolatile memory device 100 may perform a main sensing operation using a default read level based on the first read command. Data, read in the main sensing operation, will be output to the controller 200.

The controller 200 may determine whether read data, received from the nonvolatile memory device 100, passes the ECC circuit 230. When the read data passes the ECC circuit 230, a read operation may be finished. When the read data does not pass the ECC circuit 230, the controller 200 may activate an OVS mode of the nonvolatile memory device 100 and may transmit a second read command for the Page 1 to the nonvolatile memory device 100. The second read command may include information for activating the OVS mode.

The nonvolatile memory device 100 may perform an OVS sensing operation and a main sensing operation on the Page 1 in response to the second read command. The OVS sensing operation may be applied to only a predetermined state. At the same time, the nonvolatile memory device 100 may perform the main sensing operation in the state in which the OVS sensing operation is not performed. Data, read through the OVS sensing operation and the main sensing operation, may be output to the controller 200.

Then, the controller 200 may transmit a specific command (for example, a get feature command) to the nonvolatile memory device 100 to obtain OVS detection information. The nonvolatile memory device 100 may output OVS detection information to the controller 200 in response to the specific command. Then, the controller 200 may extract a read level offset using the OVS detection information and apply the extracted read level offset to a history read level table (HRT).

In addition, a determination may be made as to whether the read data passes the ECC circuit 230 once again. When the read data passes the ECC circuit 230, the read operation may be finished. When the read data does not pass the ECC circuit 230, the controller 200 may activate the OVS mode of the nonvolatile memory device 100 and may retransmit a second read command for the Page 1 to the nonvolatile memory device 100. In this case, a transmitted default read level may include a lowest read level applied to the history read level table HRT.

Then, the nonvolatile memory device 100 may perform an OVS sensing operation and a main sensing operation on the Page 1 in response to the second read command. Data, read through the OVS sensing operation and the main sensing operation, may be output to the controller 200.

Then, the controller 200 may transmit a specific command to the nonvolatile memory device 100 to obtain OVS detection information. The nonvolatile memory device 200 may output the OVS detection information to the controller 200 in response to the specific command. Then, the controller 200 may extract a read level offset using the OVS detection information and may apply the extracted read level offset to the history read level table HRT.

In an exemplary embodiment of the inventive concept, the normal read operation may be performed by a default read level, and the default read level may be changed by OVS detection information. In an exemplary embodiment of the inventive concept, the special command may include a get feature command. In an exemplary embodiment of the inventive concept, performing an on-chip valley search operation may include performing a plurality of sensing operations at develop times, respectively corresponding to different detection cases, and performing a sensing operation at a selected develop time according to a result of the plurality of sensing operations. In an exemplary embodiment of the inventive concept, the reading method may further include storing detection case information, corresponding to the selected develop time, and outputting the detection case information through a plurality of data lines.

Figure 15:
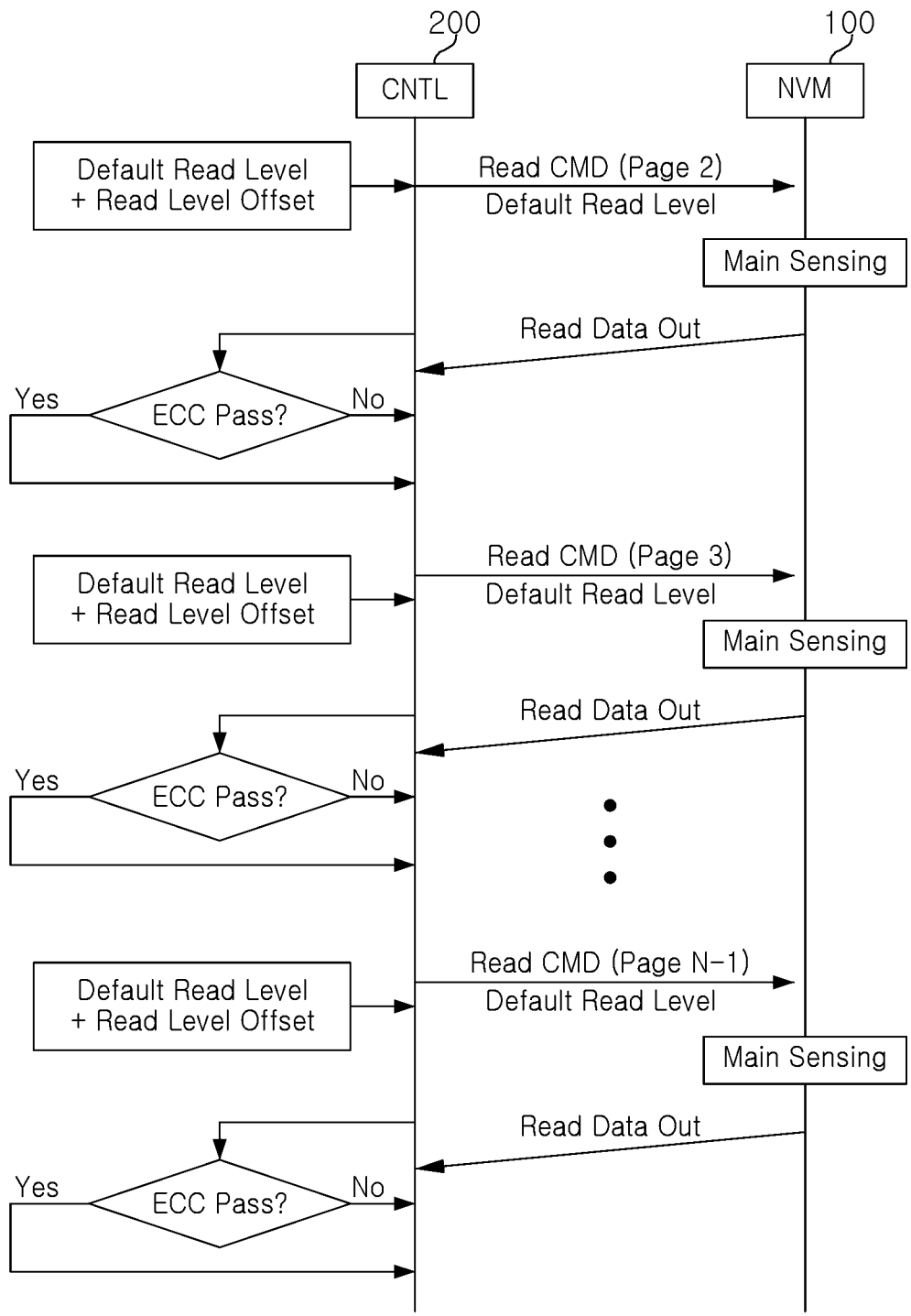
FIG. 15 is a ladder diagram illustrating a read operation using a read level offset extracted from a storage device according to an exemplary embodiment of the inventive concept.

FIG. 15 is a ladder diagram illustrating a read operation using a read level offset extracted from a storage device according to an exemplary embodiment of the inventive concept. Referring to FIG. 15, a read operation using a read level offset may be performed as follows.

As illustrated in FIG. 15, a read level offset corresponding to the OVS sensing operation may be applied to the default read level. Then, the controller 200 may transmit a first read command for the second Page 2 to the nonvolatile memory device 100 together with the default read level. The nonvolatile memory device 100 may perform a main sensing operation using an optimal default read level in response to the first read command. Data, read in the main sensing operation, may be output to the controller 200. Since the read data is read by an optimal read level, there is high probability that the read data passes the ECC circuit 230. When the read data passes the ECC circuit 230, the read operation may be finished. When the read data does not pass the ECC circuit 230, data recovery may be performed by another defense code.

Similarly to the above-described read operation, a read operation using an optimal read level based on a first read command may be performed on a Page 1 to the other third to m-th pages (Page 3 to Page m) in the same block.

A read retry operation according to an exemplary embodiment of the present inventive concept may include an OVS operation. However, the read retry operation according to an exemplary embodiment of the present inventive concept is not limited to the OVS operation.

Figure 16:
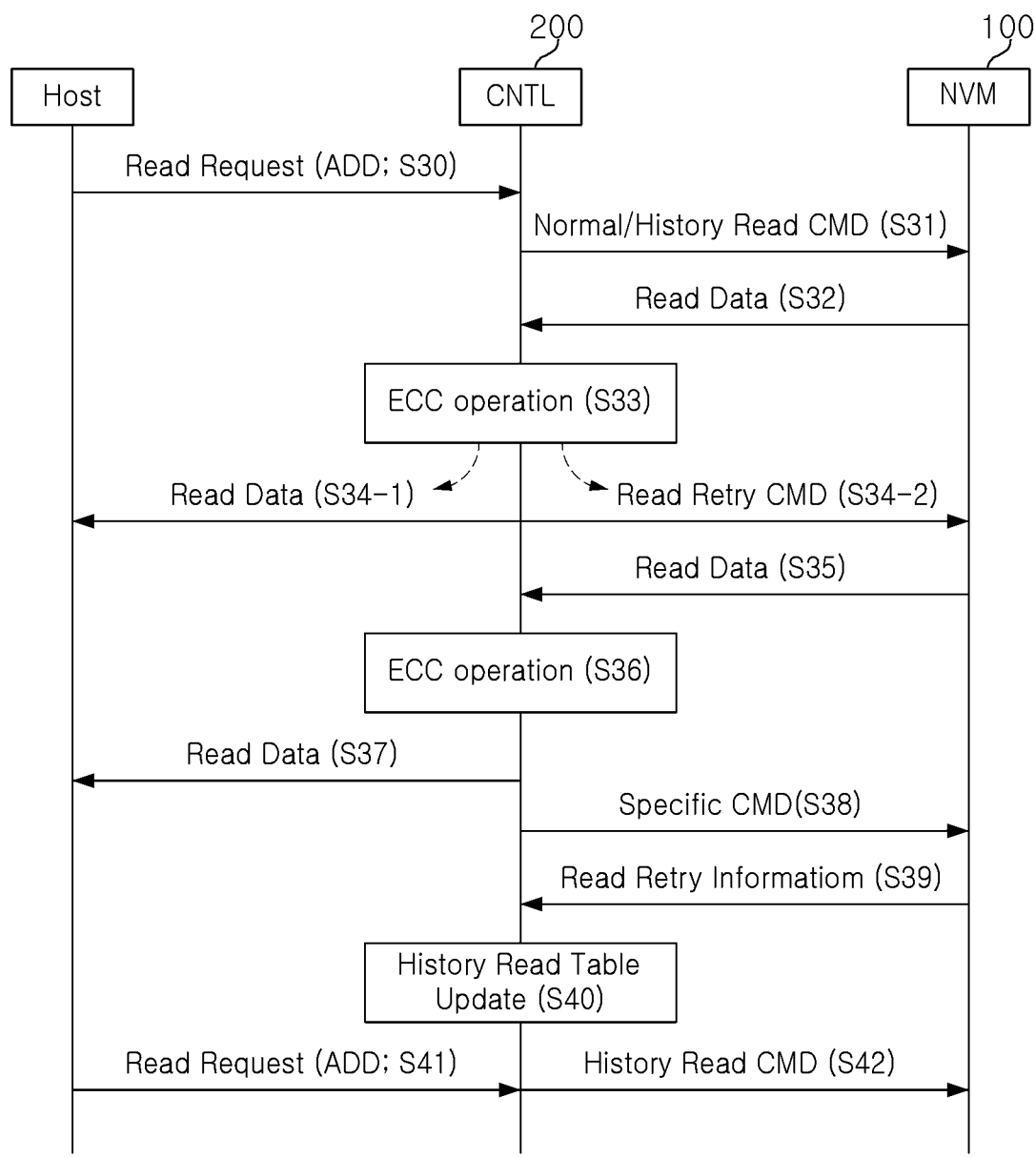
FIG. 16 is a ladder diagram illustrating a read operation of a storage device according to another exemplary embodiment of the inventive concept.

FIG. 16 is a ladder diagram illustrating a read operation of a storage device according to another exemplary embodiment of the inventive concept. Referring to FIGS. 1 and 16, a read operation of a storage device may be performed as follows.

A host may transmit a reading request, together with an address ADD, to the storage device 10 (see FIG. 1) (S30). The controller 200 of the storage device 10 may receive the reading request and may search a history buffer to determine whether to perform a history read operation or a normal read operation, and may transmit a normal/history read command, corresponding to the determined operation, to a nonvolatile memory device (NVM) 100 (see FIG. 1) (S31). The nonvolatile memory device 100 may perform a read operation in response to the normal/history read command (S31) and may transmit read data to the controller 200 (S32).

Then, the controller 200 may perform an error correction operation on data read by the ECC circuit 230 (S33). When there is no error or when an error is correctable, read data or corrected data may be transmitted to the host (S34-1).

When an error is uncorrectable, the controller 200 may transmit a read retry command to the nonvolatile memory device 100 (S34-2). The nonvolatile memory device 100 may perform a read operation in response to the read retry command and may transmit the read data to the controller 200 (S35). Then, the controller 200 may perform an error correction operation again on the data read from the ECC circuit 230 (S36). When there is no error or when an error is correctable, read data or corrected data may be transmitted to the host (S37). Then, the controller 200 may transmit a specific command to the nonvolatile memory device 100 to obtain read retry information having optimal read level information (S38). The nonvolatile memory device 100 may output the read retry information in response to the specific command (S39). Then, the controller 200 may update a history read level table HRT using the read retry information (S40).

Then, when a reading request for the same address ADD is received from the host (S41), the storage device 100 transmits a history read command using the optimal read level, reflected in the history read level table HRT, to the nonvolatile memory device 100 (S42).

In the read operation of the storage device 10 illustrated in FIG. 16, a history read operation is performed. However, the storage device 10 according to an exemplary embodiment of the present inventive concept is not limited thereto. For example, the storage device 10 may not perform the history read operation.

Figure 17:
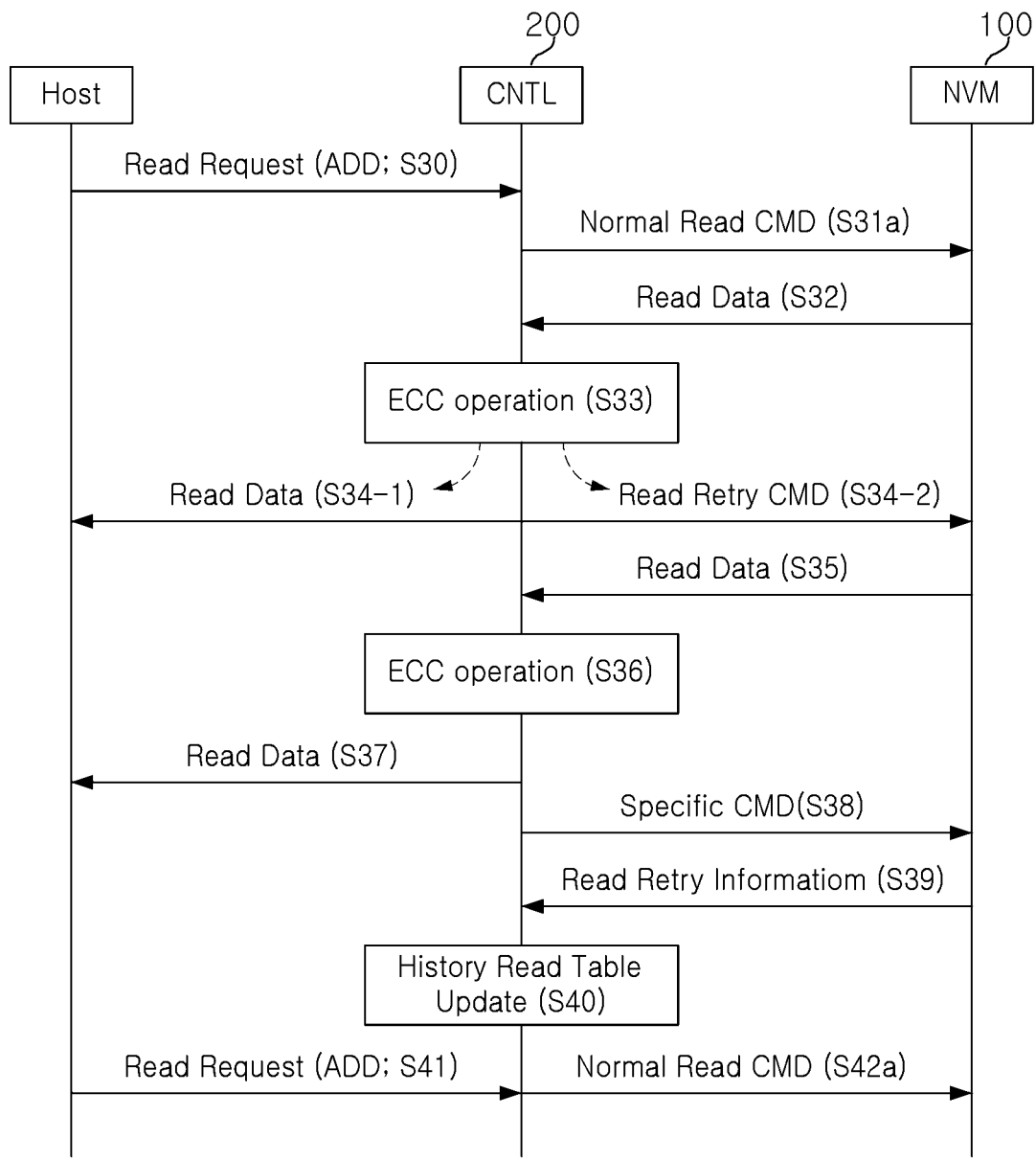
FIG. 17 is a ladder diagram illustrating a read operation of another storage device according to another exemplary embodiment of the inventive concept.

FIG. 17 is a ladder diagram illustrating a read operation of another storage device according to another exemplary embodiment of the inventive concept. Referring to FIG. 17, unlike the read operation illustrated in FIG. 16, a history read operation is not performed and normal read operations are performed (S31a and S42a). The normal read operation may be performed using an optimum read level included in a default read level table. The default read level may include an optimal read level based on read retry information.

The nonvolatile memory device 100 according to an exemplary embodiment of the inventive concept may define OVS detection cases for all states.

Figure 18A:
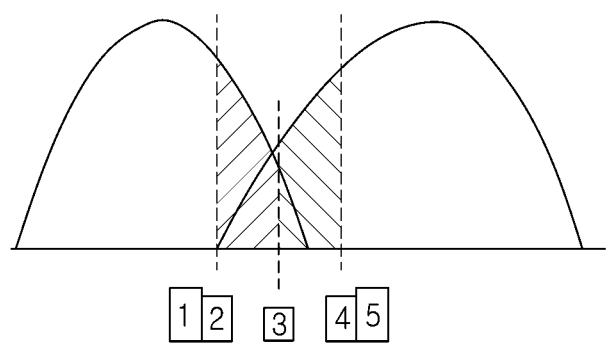
FIGS. 18A and 18B illustrate examples of OVS detection cases of a nonvolatile memory device according to exemplary embodiments of the inventive concept.
Figure 18B:
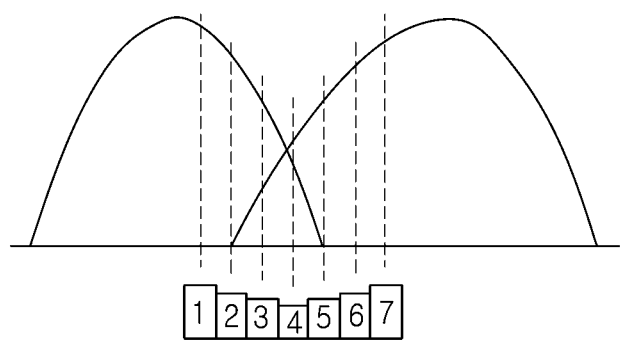

FIGS. 18A and 18B illustrate examples of OVS detection cases of a nonvolatile memory device according to exemplary embodiments of the inventive concept. Referring to FIG. 18A, five detection cases for respective OVS detection levels R1 to R5 are illustrated. Referring to FIG. 18B, seven detection cases for respective OVS detection levels R1 to R7 are illustrated. In an exemplary embodiment of the inventive concept, at least one of the seven detection cases may be set to each of most/central/least significant bit (MSB/CSB/LSB) pages.

It will be understood that the number of detection cases corresponding to a detection level according to an exemplary embodiment of the inventive concept is not limited thereto.

A decoding operation may be performed to output OVS detection information corresponding to the OVS detection case. However, the present inventive concept is not limited thereto. An OVS detection information output according to an exemplary embodiment of the present inventive concept may be implemented such that the OVS detection case and a program state of a cell are mapped in a one-to-one correspondence without performing a decoding operation on the OVS detection case.

Figures 19, 20:
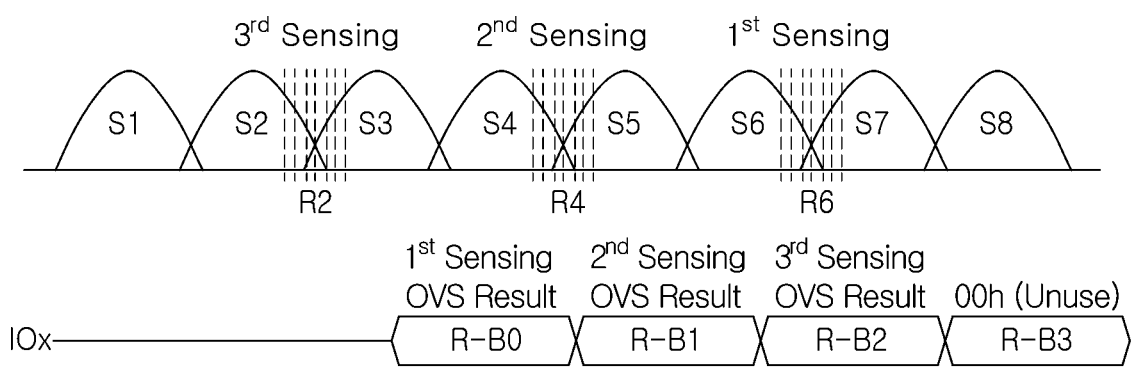
FIG. 19 illustrates an example of OVS detection information and a method of outputting the OVS detection information according to an exemplary embodiment of the inventive concept.
FIG. 20 illustrates an example of outputting OVS detection information as a specific command.

FIG. 19 illustrates an example of OVS detection information and a method of outputting the OVS detection information according to an exemplary embodiment of the inventive concept.

As illustrated in FIG. 19, OVS detection cases may match in a one-to-one correspondence with states. For example, Case 1 may match state [0] and Case 6 may match state [5]. In an exemplary embodiment of the inventive concept, the detection case may not match a most significant state.

FIG. 20 illustrates an example of outputting OVS detection information as a specific command.

An example of timing, at which OVS detection information based on a specific command is output, is illustrated in FIG. 20. A plurality of pieces of OVS detection information for a first mat address MAT2 are output. The output OVS detection information may include first sensing result information for a detection level R6, second sensing result information for a detection level R4, and third sensing result information for a detection level R2.

The storage device 10, illustrated in FIGS. 1 to 20, is changing a default read level of normal read/history read operations using a first table PDT and a second table OVST. However, a storage device of the present inventive concept is not limited thereto. The storage device according to an exemplary embodiment of the present inventive concept may change a default read level of normal read/history read operations using only an OVST.

Figure 21:
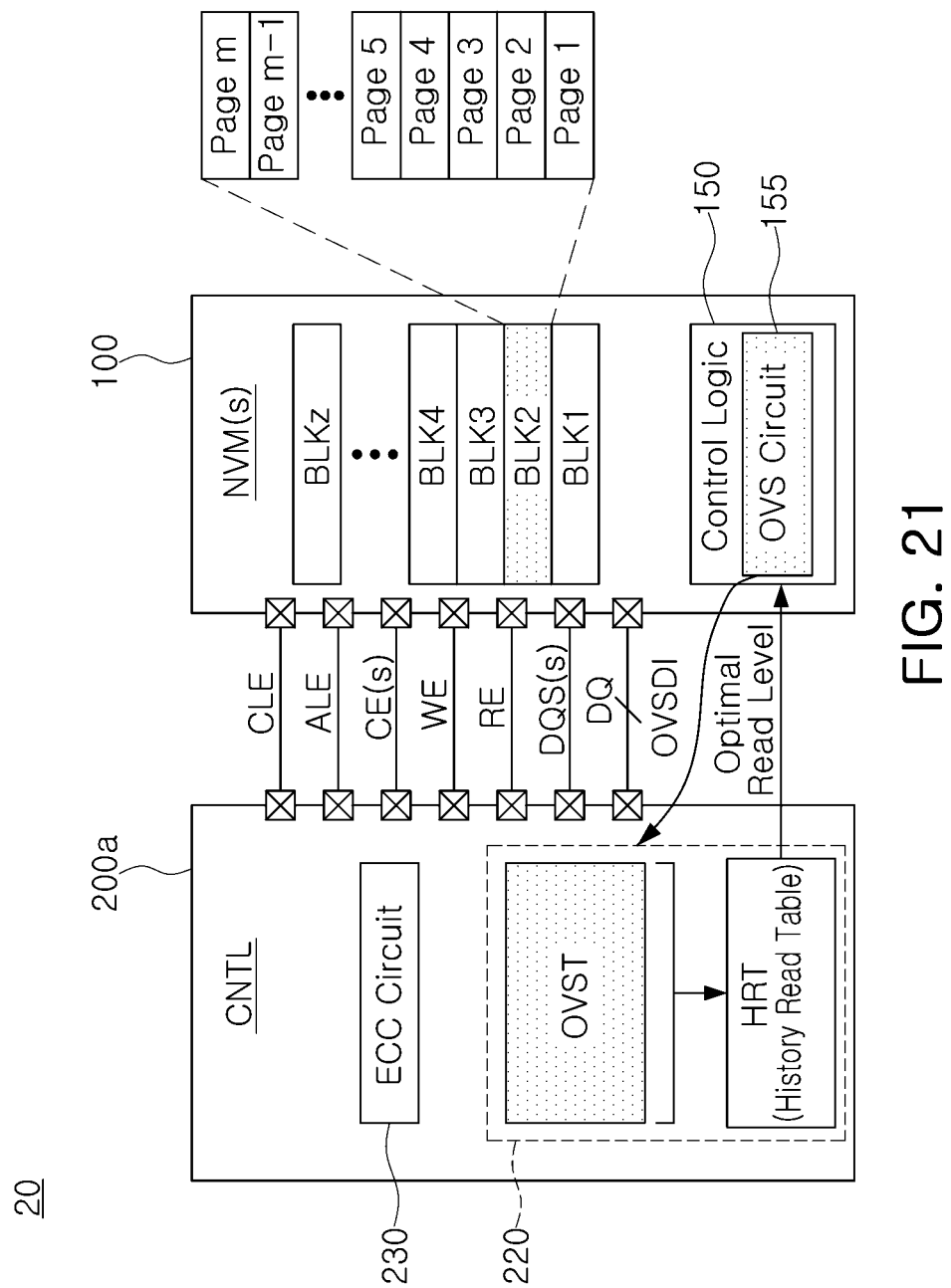
FIG. 21 illustrates a storage device according to another exemplary embodiment of the inventive concept.

FIG. 21 illustrates a storage device 20 according to another exemplary embodiment of the inventive concept.

Referring to FIG. 21, the storage device 20 does not have a first table PDT, as compared with the storage device 10 illustrated in FIG. 1 and may include a controller 200a for updating a history read level table HRT using an OVST. The storage device 20 of FIG. 21 further illustrates the CLE, ALE, CE(s), WE, RE, DQS(s) and DQ pins.

The storage device according to an exemplary embodiment of the inventive concept may have a coarse offset table for roughly managing an offset and a fine offset table for finely managing an offset, in terms of table management.

Figure 22:
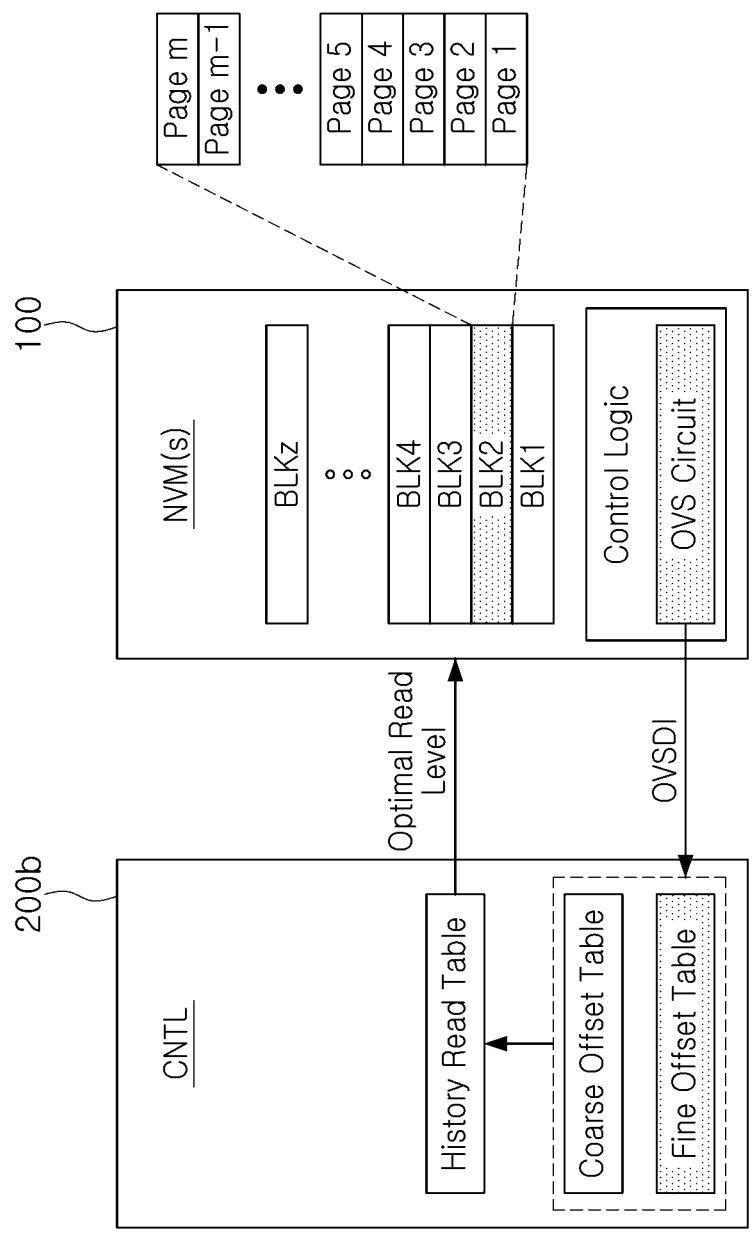
FIG. 22 illustrates a storage device according to another exemplary embodiment of the inventive concept.

FIG. 22 illustrates a storage device 30 according to another exemplary embodiment of the inventive concept. Referring to FIG. 22, the storage device 30 may include a nonvolatile memory device 100 and a controller 200b for controlling the nonvolatile memory device 100.

The controller 200b may manage a history read level table using a coarse offset table and a fine offset table, and may transmit an optimal read level to the nonvolatile memory device 100 based on the history read level table. The nonvolatile memory device 100 may perform a read operation using the optimum read level. In an exemplary embodiment of the inventive concept, the fine offset table may include offset information corresponding to OVS detection information OVSDI based on an OVS operation.

The storage device according to an exemplary embodiment of the inventive concept may be additionally reflected in a history read level table based on environment information.

Figure 23:
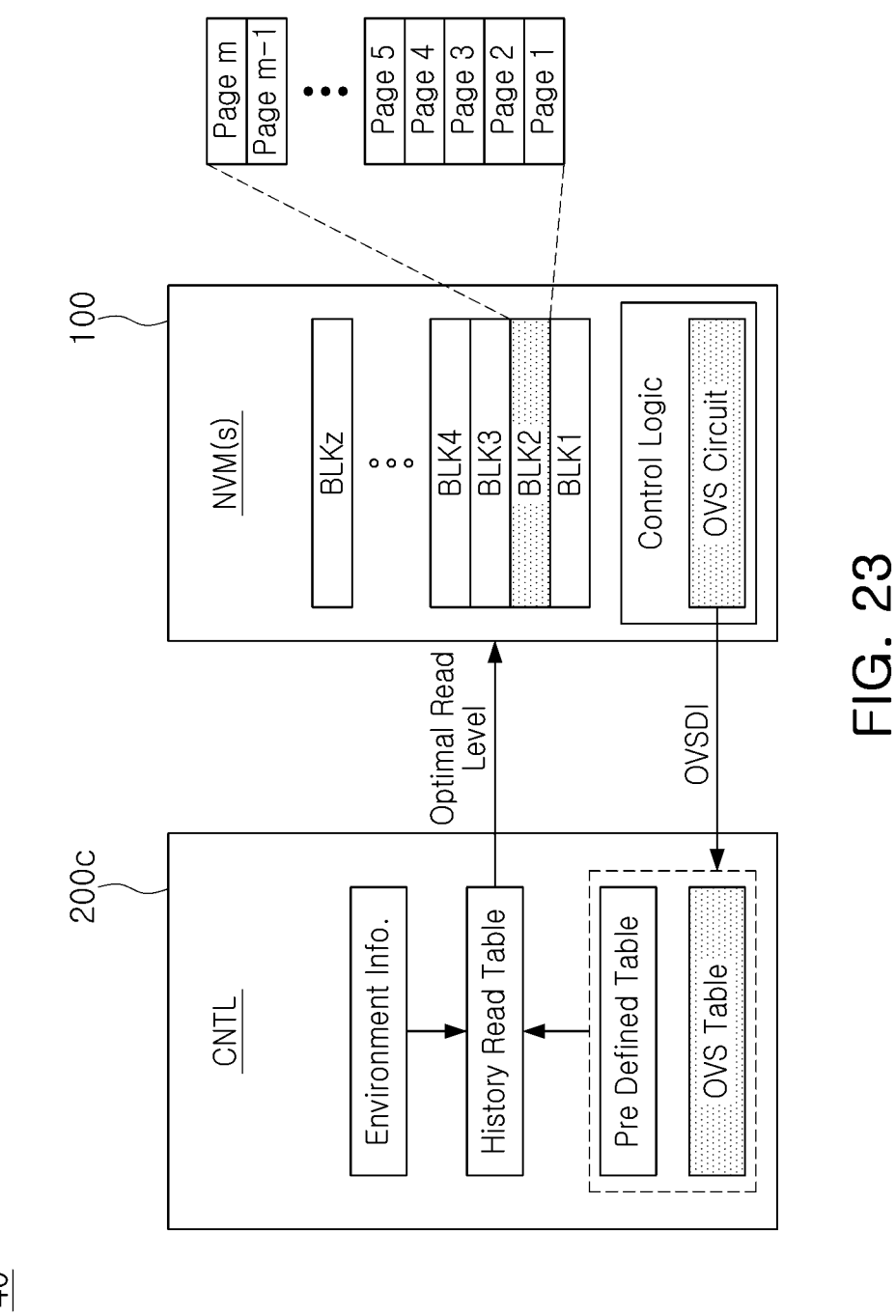
FIG. 23 illustrates a storage device according to another exemplary embodiment of the inventive concept.

FIG. 23 illustrates a storage device 40 according to another exemplary embodiment of the inventive concept. Referring to FIG. 23, the storage device 40 may include a nonvolatile memory device 100 and a controller 200c for controlling the nonvolatile memory device 100.

The controller 200c may additionally reflect environmental information in a history read level table, as compared with the controller 200 illustrated in FIG. 1. The environment information may be at least one of an elapsed program time associated with a memory cell to be read, a program temperature, a read temperature, a word line address, a block address, a die address, an erase cycle, a program cycle, a read cycle, and the like.

Figure 24:
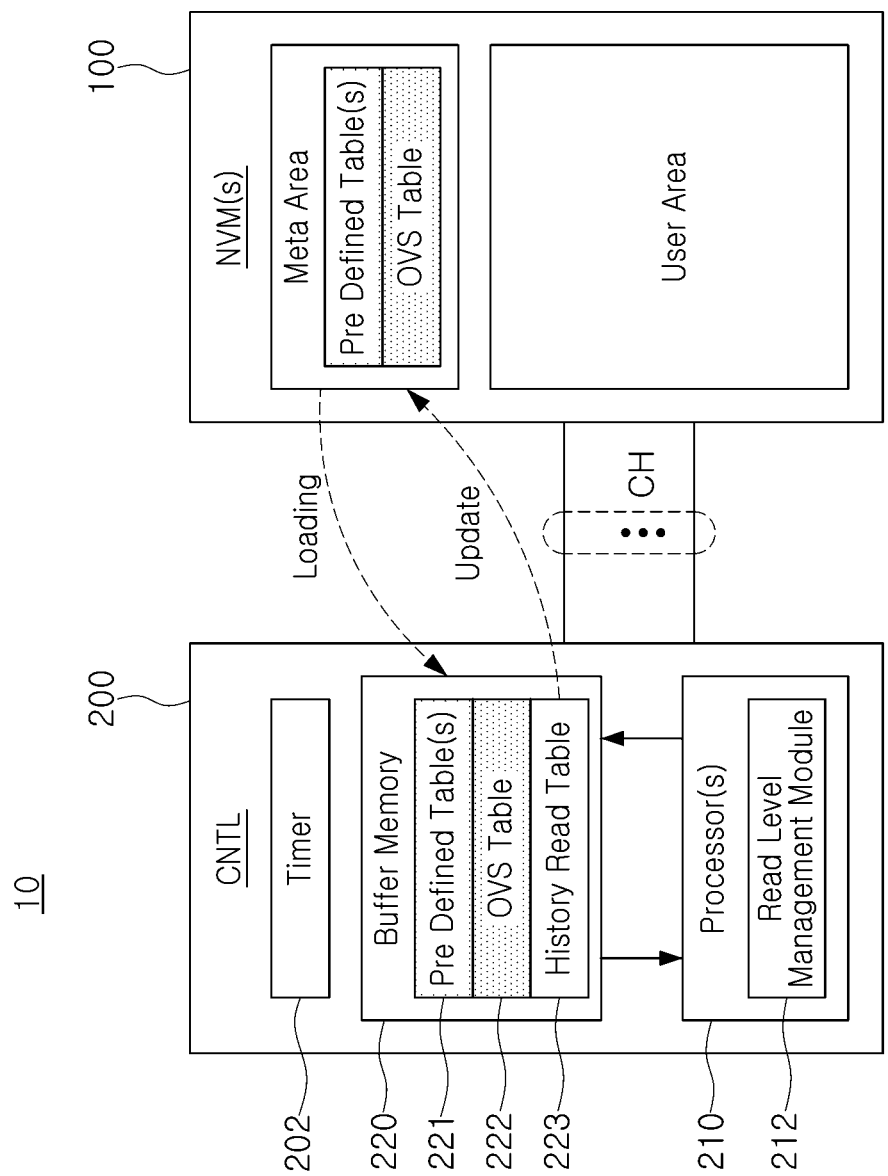
FIG. 24 illustrates table management of a storage device according to an exemplary embodiment of the inventive concept.

FIG. 24 illustrates table management of a storage device 10 according to an exemplary embodiment of the inventive concept.

Referring to FIG. 24, a nonvolatile memory device 100 may include a user area and a meta area. The user area may store user data, and may be implemented as a plurality of memory blocks described in FIGS. 1 to 3, e.g., memory blocks BLK1 to BLKz. The meta area may store management information for managing the nonvolatile memory device 100 and may be implemented as at least one memory block described in FIGS. 1 to 3, e.g., one of the memory blocks BLK1 to BLKz. The meta area may not be implemented as the same memory block as the user area.

The meta area may include a predefined table and an OVS table. The pre-defined table may store a value indicating the degree of variation of a read level depending on the lapse of a program time. When the storage device 10 is initialized, the pre-defined table and the OVS table of the meta area may be loaded in a buffer memory 220 (for example, an SRAM, a DRAM, or the like) of the controller 200. In an exemplary embodiment of the inventive concept, a history read level table 223 of the buffer memory 220 may be periodically or non-periodically updated to the meta area from the buffer memory 220.

The controller 200 may be connected to the nonvolatile memory device 100 through a channel CH. The controller 200 may include a timer 202, at least one processor 210, and the buffer memory 220. The timer 202 may be implemented in hardware/software/firmware. The timer 202 may externally receive time-associated information and may generate/output a current time. For example, the timer 202 may receive and count a system clock to generate the current time. In another exemplary embodiment of the inventive concept, the timer 202 may externally receive time information and may count an internal clock to generate a current time. In this case, the internal clock may be generated from an oscillator inside of the storage device 10.

The at least one processor 210 may control the overall operation of the storage device 10. The at least one processor 210 may perform various management operations such as cache-buffer management, firmware management, garbage collection management, wear-leveling management, data deduplication management, read refresh/reclaim management, bad block management, multi-stream management, mapping management of host data and a nonvolatile memory, quality of service (QoS) management, system resource allocation management, nonvolatile memory queue management, read level management, erase/program management, hot/cold data management, power loss protection management, dynamic thermal management, initialization management, redundant array of inexpensive disk (RAID) management, and the like.

For example, the at least one processor 210 may drive a read level management module 212. The read level management module 212 may manage related tables to transmit an optimal read level to the nonvolatile memory device 100, as described with reference to FIGS. 1 to 23.

In an exemplary embodiment of the inventive concept, the read level management module 212 may issue a special/specific command (for example, a get feature command) to the nonvolatile memory device 100 to receive OVS detection information OVSDI (see FIG. 1) and to generate an OVS table 222 corresponding to the OVS detection information. In an exemplary embodiment of the inventive concept, the read level management module 212 may update a history read level table 223 using a pre-defined table 221 and the OVS table 222. In an exemplary embodiment of the inventive concept, the read level management module 212 may transmit an optimum read level to the nonvolatile memory device 100 during a normal read operation or a history read operation.

The buffer memory 220 may temporarily store data required for driving. For example, the buffer memory 220 may store at least one pre-defined table 221, an OVS table 222, and a history read level table 223.

The buffer memory 220, illustrated in FIG. 24, is disposed inside of the controller 200. However, the present inventive concept is not limited thereto. The buffer memory 220 may be disposed as an external configuration of the controller 200. The controller 200 may further include a code memory storing at least one instruction. As the at least one instruction stored in the code memory is executed by the at least one processor 210, various management operations may be performed. The controller 200 may further include a host interface device for interfacing a host and a nonvolatile interface device for interfacing the nonvolatile memory device 100.

The nonvolatile memory device according to an exemplary embodiment of the inventive concept may be implemented in a chip-to-chip (C2C) structure.

Figure 25:
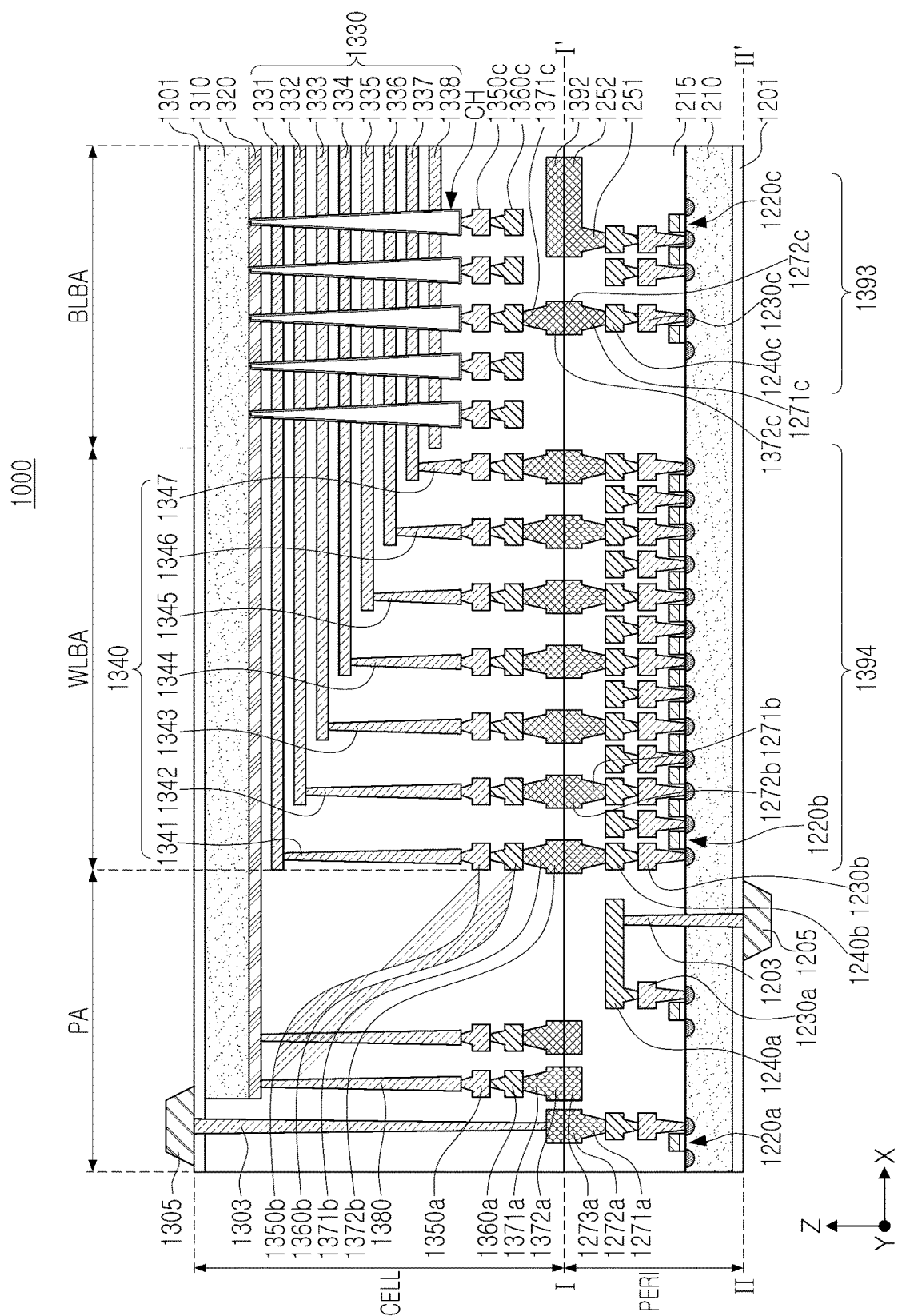
FIG. 25 illustrates a nonvolatile memory device implemented in a chip-to-chip (C2C) structure according to an exemplary embodiment of the inventive concept.

FIG. 25 illustrates a nonvolatile memory device 1000 implemented in a C2C structure according to an exemplary embodiment of the inventive concept.

The C2C structure may mean that an upper chip including a cell region CELL is manufactured on a first wafer and a lower chip including a peripheral circuit region PERI is manufactured on a second wafer, separate from the first wafer, and then bonding the upper chip and the lower chip to each other. Here, the bonding process may be a method of electrically connecting a bonding metal, formed on an uppermost metal layer of an upper chip, and a bonding metal, formed on an uppermost metal layer of a lower chip, to each other. In an exemplary embodiment of the inventive concept, when a bonding metal is copper (Cu), a Cu-to-Cu bonding may be performed. The inventive concept may not, however, be limited thereto. For example, the bonding metal may be formed of aluminum (Al) or tungsten (W).

Each of the peripheral circuit region PERI and the cell region CELL of the nonvolatile memory device 1000 may include an external pad bonding area PA, a word line bonding area WLBA, and a bit line bonding area BLBA.

The peripheral circuit region PERI may include a first substrate 1210, an interlayer insulating layer 1215, a plurality of circuit elements 1220a, 1220b, and 1220c disposed on the first substrate 1210, first metal layers 1230a, 1230b, and 1230c, respectively connected the plurality of circuit elements 1220a, 1220b, and 1220c, and second metal layers 1240a, 1240b, and 1240c disposed on the first metal layers 1230a, 1230b, and 1230c. In an exemplary embodiment of the inventive concept, the first metal layers 1230a, 1230b, and 1230c may be formed of tungsten (W) having relatively high electrical resistance. In an exemplary embodiment of the inventive concept, the second metal layers 1240a, 1240b, and 1240c may be formed of copper (Cu) having relatively low electrical resistance.

In FIG. 25, the first metal layers 1230a, 1230b, and 1230c and the second metal layers 1240a, 1240b, and 1240c are illustrated, but the present inventive concept is not limited thereto. One or more additional metal layers may be further provided on the metal layers 1240a, 1240b, and 1240c. At least some of the one or more additional metal layers, provided on the second metal layers 1240a, 1240b, and 1240c, may be formed of aluminum (Al), or the like, having lower electrical resistance than copper (Cu) used to form the second metal layers 1240a, 1240b, and 1240c.

In an exemplary embodiment of the inventive concept, the interlayer insulating layer 1215 may be disposed on the first substrate 1210 to cover the plurality of circuit elements 1220a, 1220b, and 1220c, the first metal layers 1230a, 1230b, and 1230c, and the second metal layers 1240a, 1240b, and 1240c. In an exemplary embodiment of the inventive concept, the interlayer insulating layer 1215 may include an insulating material such as a silicon oxide, a silicon nitride, or the like.

Lower bonding metals 1271b and 1272b may be provided on the second metal layer 1240b in the word line bonding region WLBA. In the word line bonding area WLBA, the lower bonding metals 1271b and 1272b of the peripheral circuit region PERI may be electrically bonded to upper bonding metals 1371b and 1372b of the cell region CELL using a bonding method. In an exemplary embodiment of the inventive concept, the lower bonding metals 1271b and 1272b and the upper bonding metals 1371b and 1372b may be formed of aluminum (Al), copper (Cu), tungsten (W), or the like. Further, the upper bonding metals 1371b and 1372b in the cell region CELL may be referred as first metal pads and the lower bonding metals 1271b and 1272b in the peripheral circuit region PERI may be referred as second metal pads.

The cell region CELL may include at least one memory block. In an exemplary embodiment of the inventive concept, the cell region CELL may include a second substrate 1310 and a common source line 1320. A plurality of word lines 1331, 1332, 1333, 1334, 1335, 1336, 1337 and 1338 (collectively, 1330) may be stacked on the second substrate 1310 in a direction, perpendicular to an upper surface of the second substrate 1310, (e.g., a Z-axis direction). In an exemplary embodiment of the inventive concept, string select lines and a ground select line may be disposed above and below the word lines 1330, respectively. In an exemplary embodiment of the inventive concept, a plurality of the word lines 1330 may be disposed between the string select lines and the ground select line.

In the bit line bonding area BLBA, a channel structure CH may extend in a direction (e.g., a Z-axis direction), perpendicular to the upper surface of the second substrate 1310, to penetrate through the word lines 1330, the string select lines, and the ground select line. The channel structure CH may include a data storage layer, a channel layer, a buried insulating layer, and the like. The channel layer may be electrically connected to a first metal layer 1350c and a second metal layer 1360c. For example, the first metal layer 1350c may be a bit line contact and the second metal layer 1360c may be a bit line. In an exemplary embodiment of the inventive concept, the bit line 1360c may extend in a first direction (e.g., a Y-axis direction), parallel to the upper surface of the second substrate 1310.

As illustrated in FIG. 25, an area in which the channel structure CH and the bit line 1360c are disposed may be the bit line bonding area BLBA. In an exemplary embodiment of the inventive concept, in the bit line bonding area BLBA, the bit line 1360c may be electrically connected to circuit elements 1220c providing a page buffer 1393 in the peripheral circuit region PERI. The bit line 1360c may be connected to upper bonding metals 1371c and 1372c in the peripheral circuit region PERI. The upper bonding metals 1371c and 1372c may be connected to lower bonding metals 1271c and 1272c connected to the circuit elements 1220c of the page buffer 1393.

In the word line bonding area WLBA, the word lines 1330 may extend in a second direction (e.g., an X-axis direction), parallel to the upper surface of the second substrate 1310 and perpendicular to the first direction. In an exemplary embodiment of the inventive concept, the word line bonding area WLBA may be connected to a plurality of cell contact plugs 1341, 1342, 1343, 1344, 1345, 1346 and 1347 (collectively, 1340). For example, the word lines 1330 and the cell contact plugs 1340 may be connected to each other on pads, in which at least some of the word lines 1330 are provided to extend in different lengths, in the second direction. In an exemplary embodiment of the inventive concept, a first metal layer 1350b and a second metal layer 1360b may be sequentially connected to upper portions of the cell contact plugs 1340 connected to the word lines 1330. In an exemplary embodiment of the inventive concept, in the wordline bonding area WLBA, the cell contact plugs 1340 may be connected to the peripheral circuit region PERI through the upper bonding metals 1371b and 1372b in the cell region CELL and the lower bonding metals 1271b and 1272b in the peripheral circuit region PERI.

In an exemplary embodiment of the inventive concept, the cell contact plugs 1340 may be electrically connected to circuit elements 1220b forming a row decoder 1394 in the peripheral circuit region PERI. In an exemplary embodiment of the inventive concept, an operating voltage of the circuit elements 1220b, forming the row decoder 1394, may be different from an operating voltage of the circuit elements 1220c forming the page buffer 1393. For example, the operating voltage of the circuit elements 1220c, forming the page buffer 1393, may be higher than the operating voltages of the circuit elements 1220b forming the row decoder 1394.

A common source line contact plug 1380 may be disposed in the external pad bonding area PA. In an exemplary embodiment of the inventive concept, the common source line contact plug 1380 may be formed of a conductive material such as a metal, a metal compound, polysilicon, or the like. The common source line contact plug 1380 may be electrically connected to the common source line 1320. A first metal layer 1350a and a second metal layer 1360a may be sequentially stacked on the common source line contact plug 1380. The second metal layer 1360a is electrically connected to an upper metal via 1371a. The upper metal via 1371a is electrically connected to an upper metal pattern 1372a. For example, an area in which the common source line contact plug 1380, the first metal layer 1350a, and the second metal layer 1360a are disposed may be an external pad bonding area PA.

Input/output pads 1205 and 1305 may be disposed in the external pad bonding area PA. Referring to FIG. 25, a lower insulating layer 1201 may be provided below the first substrate 1210 to cover a lower surface of the first substrate 1210. A first input/output pad 1205 may be provided on the lower insulating layer 1201. In an exemplary embodiment of the inventive concept, the first input/output pad 1205 may be connected to at least one of the plurality of circuit elements 1220a, 1220b, and 1220c, disposed in the peripheral circuit region PERI, through the first input/output contact plug 1203. In an exemplary embodiment of the inventive concept, the first input/output pad 1205 may be separated from the first substrate 1210 by the lower insulating layer 1201. In addition, a side insulating layer may be disposed between the first input/output contact plug 1203 and the first substrate 1210 to electrically separate the first input/output contact plug 1203 and the first substrate 1210 from each other. In the present embodiment, the second input-output pad 1305 is electrically connected to a circuit element 1220a.

Referring to FIG. 25, an upper insulating layer 1301 may be provided on the second substrate 1310 to cover the upper surface of the second substrate 1310. A second input/output pad 1305 may be disposed on the upper insulating layer 1301. In an exemplary embodiment of the inventive concept, the second input/output pad 1305 may be connected to at least one of the plurality of circuit elements 1220a, 1220b, and 1220c, disposed in the peripheral circuit region PERI, through the second input/output contact plug 1303, a lower metal pattern 1272a and a lower metal via 1271a.

In an exemplary embodiment of the inventive concept, the second substrate 1310, the common source line 1320, and the like, may not be disposed in a region in which the second input/output contact plug 1303 is disposed. The second input/output pad 1305 may not overlap the word lines 1380 in the third direction (e.g., the Z-axis direction). Referring to FIG. 25, the second input/output contact plug 1303 may be separated from the second substrate 1310 in a direction, parallel to the upper surface of the second substrate 1310. In addition, the second input/output contact plug 1303 may be connected to the second input/output pad 1305 through the interlayer insulating layer 1315 in the cell region CELL.

In an exemplary embodiment of the inventive concept, the first input/output pad 1205 and the second input/output pad 1305 may be selectively provided. For example, the nonvolatile memory device 1000 may include only the first input/output pad 1205, provided on the first substrate 1201, or only the second input/output pad 1305 provided on the second substrate 1301. In another exemplary embodiment of the inventive concept, the nonvolatile memory device 1000 may include both the first input/output pad 1205 and the second input/output pad 1305.

A metal pattern provided on an uppermost metal layer may be present as a dummy pattern or may not be present in each of the external pad bonding area PA and the bit line bonding area BLBA included in each of the cell region CELL and the peripheral circuit region PERI.

In the external pad bonding area PA, the nonvolatile memory device 1000 according to an exemplary embodiment of the inventive concept may include a lower metal pattern 1273a, provided on the uppermost metal layer in the peripheral circuit region PERI to correspond to an upper metal pattern 1372a provided on the uppermost metal layer in the cell region CELL, having the same cross-sectional shape as the upper metal pattern 1372a in the cell region CELL to be connected to each other. The lower metal pattern 1273a, provided on the uppermost metal layer in the peripheral circuit region PERI, may not be connected to an additional contact in the peripheral circuit region PERI. Similarly, in the external pad bonding area PA, the nonvolatile memory device 1000 may include an upper metal pattern 1372a, provided on the uppermost metal layer in the peripheral circuit region PERI to correspond to a lower metal pattern 1273a provided on the uppermost metal layer in the peripheral circuit region PERI, having the same shape as the lower metal pattern 1273a in the peripheral circuit region PERI.

Lower bonding metals 1271b and 1272b may be provided on the second metal layer 1240b in the word line bonding region WLBA. In an exemplary embodiment of the inventive concept, in the word line bonding area WLBA, the lower bonding metals 1271b and 1272b in the peripheral circuit area PERI may be electrically connected to the upper bonding metals 1371b and 1372b in the cell region CELL by a Cu-to-Cu bonding.

Further, in the bit line bonding area BLBA, the nonvolatile memory device 1000 may include an upper metal pattern 1392, provided on the uppermost metal layer in the cell region CELL to correspond to a lower metal pattern 1252 provided on the uppermost metal layer in the peripheral circuit region PERI, having the same cross-sectional shape as the lower metal pattern 1252 in the peripheral circuit region PERI. The lower metal pattern 1252 is electrically connected to a lower metal via 1251. A contact may not be formed on the upper metal pattern 1392 provided on the uppermost metal layer in the cell region CELL.

In an exemplary embodiment of the inventive concept, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

The nonvolatile memory device according to an exemplary embodiment of the inventive concept may perform a main sensing operation using a default read level and an OVS sensing operation using an on-chip valley search. A controller, controlling the nonvolatile memory device, may include a pre-defined table PDT and an OVST to correct a read failure. The pre-defined table PDT is a read level offset table predetermined in consideration of retention, and may be referred to when a read failure occurs and may be used to change a read level. The OVST is a table in which a develop time depending on each valley location is converted into a read level offset using an OVS sensing operation, and may include a product of the number of valleys (N), searched by the OVS sensing operation, and the number of program states (M). For example, when the number of TLC valley search detection cases is 5, N is 5 and M is 7. The OVST is a table pre-formed in an evaluation step of a nonvolatile memory device (for example, a NAND flash memory). In a first step, a detect case vs. a develop time offset table is formed. In a second step, a develop time offset vs. a read level offset table is formed. In a third or final step, a detect case vs. a read level offset table is formed as the OVST.

The OVST is stored in a memory of the controller and may be used to determine a read level of the next word line according to detection case information output as a status out/get feature/UIB out during a solution operation. The pre-defined table PDT and the OVST, included in the controller, may be used after adding two level offsets thereto. Alternatively, only the level offset of the OVST may be used.

A main sensing operation may be performed using a default read level before a read failure occurs. On the other hand, an OVS sensing operation may be performed when a read failure occurs and accordingly a read retry operation and a recovery operation are performed. The OVS sensing operation may include a first sensing step of searching an OVS detection case based on a cell count and a second sensing step of changing an actual develop time based on the searched detection case and sensing the changed actual develop time.

In a reading method of a nonvolatile memory device according to an exemplary embodiment of the inventive concept, an OVS sensing operation, using on-chip valley search only during a read retry operation after read fail occurs, may be activated. When a read operation passes at an optimal develop time searched by an OVS sensing operation during a read retry operation, OVS detection information corresponding to the develop time, at which the read operation passes, may be output as a status out/get feature/UIB out after the read operation is finished. In an exemplary embodiment of the inventive concept, the develop time may be converted into a read level offset corresponding to OVS detection information through a pre-formed OVST, and read level offset information may be stored by adding PDT information and OVST output information to a history read level table. In an exemplary embodiment of the inventive concept, in the next word line read operation, a read operation may be performed at a history read level updated to first PDT information and OVST information. In this case, an OVS sensing operation is not activated. Then, when a read failure occurs at the history read level in the next word line read operation, a read operation may be performed using second PDT information. In this case, the OVS sensing operation may be activated again.

In the storage device and the reading method of the storage device according to an exemplary embodiment of the inventive concept, in a current read operation, an optimal valley location may be searched in a first read step and data may be sensed in a second read step, and then information on the searched OVS valley location may be output as a status out or a get feature. In the next read operation, the storage device may determine the next read level using the OVS location information, output in the previous read operation, and a pre-formed table.

In the storage device and the reading method of the storage device according to an exemplary embodiment of the inventive concept, location information may be obtained by a develop time after searching a valley in a data recovery flow. After searching the valley, the location information may be output as a status out or a get feature and a develop time vs. a read level conversion table may be pre-formed to correct a read level.

In the storage device and the reading method of the storage device according to an exemplary embodiment of the inventive concept, since a UECC is issued and then used as only a defense code, a read time may be increased only when entering a first defense code and a user read time may not be increased.

In the storage device and the reading method of the storage device according to an exemplary embodiment of the inventive concept, an on-chip valley search may be used for only a recovery flow after a UECC is issued. In addition, a table for converting a develop time into a read level may be used as a correction means, and a read operation for data recovery may be performed only once.

As described above, according to exemplary embodiments of the inventive concept, OVS detection information may be reflected in an optimal read level to perform a read operation to prevent deterioration of performance while securing reliability.

While the present inventive concept has been shown and described with reference to exemplary embodiments thereof, it will be apparent to those skilled in the art that modifications and variations could be made thereto without departing from the scope of the present inventive concept as set forth by the appended claims.

What is claimed is:

1. A controller, comprising:
control pins for providing control signals to a nonvolatile memory device;
a buffer memory configured to store a first table, a second table, and a third table; and
an error correction code (ECC) circuit configured to correct an error in first data read from the nonvolatile memory device according to a first read command,
wherein the first table stores first offset information,
the second table stores second offset information, and
the third table stores third offset information, wherein the third offset information corresponds to a history read level and is determined by the first offset information and the second offset information, and
when the error of the first data is uncorrectable by the error correction code circuit, an on-chip valley search operation is performed by the nonvolatile memory device according to a second read command, detection information of the on-chip valley search operation is received according to a specific command, and the second offset information which corresponds to the detection information is generated.

2. The controller of claim 1, wherein the first offset information includes read level offset information based on a program elapsed time.

3. The controller of claim 1, wherein the detection information includes information corresponding a develop time of the on-chip valley search operation, and the second offset information includes read level offset information corresponding to the develop time.

4. The controller of claim 1, wherein the history read level includes a default read level of a normal read operation or a history read operation.

5. The controller of claim 1, wherein when an external reading, request is received a determination is made as to whether to perform a normal read operation or a history read operation.

6. The controller of claim 1, wherein the specific command includes a get feature command.

7. The controller of claim 1, wherein the control signals include a command latch enable (CLE) signal, an address latch enable (ALE) signal, a chip enable (CE) signal, a write enable (WE) signal, a read enable (RE) signal, and DQS signals, the nonvolatile memory device performs a read operation by latching a command or an address on an edge of the WE signal according to the CLE signal and the ALE signal, and an off-chip valley search operation is performed when a read operation based on the on-chip valley search operation does not pass.

\* \* \* \* \*